United States Patent
Yoshitake

(10) Patent No.: US 11,475,557 B2
(45) Date of Patent: Oct. 18, 2022

(54) MASK INSPECTION APPARATUS, ELECTRON BEAM INSPECTION APPARATUS, MASK INSPECTION METHOD, AND ELECTRON BEAM INSPECTION METHOD

(71) Applicant: NuFlare Technology, Inc., Yokohama (JP)

(72) Inventor: Shusuke Yoshitake, Yokohama (JP)

(73) Assignee: NuFlare Technology, Inc., Yokohama (JP)

(*) Notice: Subject to any disclaimer, the term of this patent is extended or adjusted under 35 U.S.C. 154(b) by 335 days.

(21) Appl. No.: 16/879,897

(22) Filed: May 21, 2020

(65) Prior Publication Data

US 2020/0394778 A1 Dec. 17, 2020

(30) Foreign Application Priority Data

Jun. 11, 2019 (JP) .............................. JP2019-108445

(51) Int. Cl.
*G06T 7/00* (2017.01)
*H01J 37/28* (2006.01)
*G03F 7/20* (2006.01)

(52) U.S. Cl.
CPC .......... *G06T 7/001* (2013.01); *G03F 7/70033* (2013.01); *H01J 37/28* (2013.01); *G06T 2207/10061* (2013.01); *G06T 2207/30148* (2013.01); *H01J 2237/2817* (2013.01)

(58) Field of Classification Search
CPC ................. G06T 7/001; G06T 7/70033; G06T 2207/10061; G06T 2207/30148; H01J 37/28; H01J 2237/2817
See application file for complete search history.

(56) References Cited

FOREIGN PATENT DOCUMENTS

JP 2015-43100 A 3/2015

OTHER PUBLICATIONS

Mochi, I. et al., "Lensless Actinic Inspection of EUV Reticles with RESCAN," EUVL Symposium, 2016, 10 pages.
Mochi, I. et al., "RESCAN: an actinic lensless microscope for defect inspection of EUV reticles," Journal of Micro/Nanolithography, MEMS, and MOEMS, vol. 16, Issue. 4, Jul. 27, 2017, https://doi.org/10.1117/1_JMM.16.4_041003, 12 pages.

*Primary Examiner* — Nicole M Ippolito
*Assistant Examiner* — Hanway Chang
(74) *Attorney, Agent, or Firm* — Oblon, McClelland, Maier & Neustadt, L.L.P.

(57) ABSTRACT

A mask inspection apparatus includes an image acquisition mechanism that acquires an optical image of the pattern by making an inspection light incident on an EUV mask and detecting a reflection inspection light reflected from the EUV mask, in a state where the relation between the incident direction of the inspection light used for inspecting the pattern formed on the EUV mask, and the arrangement direction of the EUV mask serving as the inspection substrate is matched with the relation between the incident direction of the EUV light on the EUV mask, and the arrangement direction of the EUV mask in the EUV exposure apparatus.

10 Claims, 16 Drawing Sheets

MASK INSPECTION APPARATUS, ELECTRON BEAM INSPECTION APPARATUS, MASK INSPECTION METHOD, AND ELECTRON BEAM INSPECTION METHOD

CROSS-REFERENCE TO RELATED APPLICATION

This application is based upon and claims the benefit of priority from prior Japanese Patent Application No. 2019-108445 filed on Jun. 11, 2019 in Japan, the entire contents of which are incorporated herein by reference.

BACKGROUND OF THE INVENTION

Field of the Invention

Embodiments of the present invention relate to a mask inspection apparatus, an electron beam inspection apparatus, a mask inspection method, and an electron beam inspection method. For example, embodiments of the present invention relate to an EUV (Extreme Ultraviolet) mask inspection apparatus, an EUV mask inspection method, and an apparatus and method for inspecting a substrate to which exposure and transfer of a pattern has been performed using an EUV mask.

Description of Related Art

In recent years, with the advance of high integration and large capacity of Large Scale Integrated (LSI) circuits, the line width (critical dimension) required for circuits of semiconductor elements is becoming progressively narrower. Such semiconductor elements are manufactured through circuit-forming by repeating exposing/transferring a circuit pattern onto a semiconductor substrate (wafer) with an exposure apparatus, using an original or "master" (also called a mask or a reticle, hereinafter generically referred to as a mask) on which a circuit pattern has been formed.

Since LSI manufacturing requires a tremendous amount of manufacturing cost, it is crucial to improve its yield. Therefore, the mask inspection apparatus for inspecting defects of a mask pattern formed on the mask needs to be highly accurate.

With miniaturization of semiconductor devices, it is examined to further shorten the exposure wavelength itself compared to a conventional DUV light (wavelength 193 nm). Among various proposed lithography techniques, EUV lithography using light with a wavelength of 13.5 nm is the most promising at present for high volume production. Since the EUV light having a wavelength in the soft X-ray region is penetrated and absorbed by many materials, it cannot build a reduction projection optical system using a lens like a conventional lithography system with a DUV light. Therefore, the reflective optical system using a multilayer mirror whose reflectance is comparatively high to an EUV light is proposed as a means to configure a reduction optical system using an EUV light. Thus, the reflective optical system composed of a plurality of multilayer mirrors which reflect EUV lights is used in the EUV lithography. Then, a reflection-type mask is employed which selectively reflects an EUV light from a pattern.

As a method of inspecting an EUV mask, there is known a method (die-to-database inspection) of comparing an optical image and a reference image, where the optical image is obtained by imaging, at a predetermined magnification, a pattern formed on the mask with the conventional illumination optical system having a wavelength near 193 nm being the same as that of a DUV light, and the reference image is computationally generated, while taking account of a deformation at patterning process and an image blur at light projecting, with respect to a design pattern image based on design pattern data being a basis of the optical image. In the conventional immersion lithography using a DUV light, since resolution is restricted by the numerical aperture (1.35) determined by a light wavelength (193 nm) and a refractive index of material (lens, liquid, resist), miniaturization with smaller line width (critical dimension) of a circuit pattern than 45 nm on a semiconductor substrate (wafer) has been achieved by contriving the subsequent process. In the EUV lithography, a pattern to be transferred and resolved have been reduced due to shortening wavelength. Since the reduction ratio of the exposure apparatus has not changed (¼), the size of the EUV mask is the same as that of the photomask used in the conventional immersion lithography. Moreover, in the EUV lithography, critical dimensions of a pattern formed on the EUV mask can be reduced due to an effect of shortening wavelength, compared to a conventional photomask. Therefore, even if using the conventional image forming optical system utilizing a DUV light, it may be impossible to form an image by focusing a pattern formed on the EUV mask and defects around the pattern. Then, relating to defect inspection of the EUV mask, it is proposed to perform the inspection using an EUV light or an electron beam. In that case, similarly to the conventional inspection method, a reference image is computationally generated with each light source and each imaging method so as to be compared for inspection (die-to-database inspection). With respect to the inspection method of the inspection apparatus, after performing alignment between images, the images are compared based on an appropriate algorithm. If a difference in the compared data with each other exists, it is determined that there is a pattern defect. With the pattern inspection apparatus described above, a pattern image on the target EUV mask is obtained by irradiating the substrate with an extreme ultraviolet (EUV) light or an EB in order to acquire a reflection image.

With respect to the EUV mask, an absorber layer is needed to selectively absorb/block an EUV light, depending on a circuit pattern. For absorbing an EUV light with a wavelength of 13.5 nm, a layer of Ta-based material of film thickness of about 70 nm is needed, for example. Moreover, in order that the EUV mask may lead an EUV light, having been incident as a part of the reflective optical system, to the wafer, it is necessary to use a light diagonally (obliquely) incident on the EUV mask acting as a reflective mirror so as to be reflected. Although there is an angular dependence in the reflectance of the EUV light with respect to the multilayer film, the incident angle of the EUV light on the EUV mask has been determined (about six degrees against the perpendicular direction to the mask surface) so that the EUV light can be used in the range where the reflectance change is as small as possible. At this time, a part of an EUV light incident on the multilayer mirror or an EUV light reflected from the multilayer mirror is blocked because an absorber layer pattern having a film thickness of 70 nm and formed three-dimensionally becomes a barrier on the incident path, depending on the incident direction of the EUV light. Therefore, change of critical dimensions of the absorber layer pattern may occur in patterns transferred to the wafer. The same thing may happen to a pattern detected by an inspection apparatus using EUV lights.

As an inspection apparatus for inspecting a target object such as a wafer onto which a pattern has actually been transferred using the EUV mask concerned, there is examined/studied an inspection apparatus using electron beams. In the case of the inspection apparatus for inspecting a target object such as a wafer using electron beams, in order to acquire an image in a region on the target object surface having been exposed and printed by the exposure apparatus, electron beams scanning is performed to acquire a secondary electron emitted from the target object surface so as to obtain a pattern image formed on the target object. At this time, since many secondary electrons are emitted from the edge portion of a pattern, if the scanning direction of an electron beam and the pattern are vertical to each other, information on the edge portion can be acquired much. However, if the scanning direction of an electron beam and the pattern are parallel to each other, there may be a problem that information from the edge cannot be acquired much.

Here, although not being an inspection apparatus, there is disclosed a technique, with respect to a writing apparatus for writing a pattern on an EUV mask, wherein an identifier (ID) capable of reading the position of a phase defect of a mask blank for EUV is formed on the mask blank, and a layout is performed such that a defect overlaps with the position where an absorber remains (e.g., refer to Japanese Patent Application Laid-open (JP-A) No. 2015-043100).

BRIEF SUMMARY OF THE INVENTION

According to one aspect of the present invention, a mask inspection apparatus includes:

an acquisition mechanism that acquires exposure apparatus information indicating an arrangement direction of an EUV (Extreme Ultraviolet) mask with a pattern formed thereon in an exposure apparatus which illuminates a large circular arc of a few millimeter height and about 104 millimeter width which corresponds to the chip width on a substrate, on the desired region of the EUV mask with an EUV light in an incident angle of a predetermined direction and prints the pattern of the EUV mask in four or eight times reduction ratio to a target object using a reflected EUV light thereon in one direction by a movement of a mask stage to mount the EUV mask thereon in a direction being perpendicular to a plane including an incident direction and a reflection direction of the EUV light with respect to the EUV mask in the exposure apparatus and being parallel to a pattern forming surface of the EUV mask, and the incident direction of the EUV light to the EUV mask;

a stage that mounts the EUV mask thereon such that a relation between an incident direction of an inspection light used for inspecting the pattern formed on the EUV mask, and the arrangement direction of the EUV mask serving as an inspection substrate is matched with a relation between the incident direction of the EUV light on the EUV mask, and the arrangement direction of the EUV mask in the exposure apparatus, based on a relation indicated by the exposure apparatus information acquired;

an image acquisition mechanism that acquires an optical image of the pattern by making the inspection light incident on the EUV mask and detecting a reflection inspection light reflected from the EUV mask, in a state where the relation between the incident direction of the inspection light used for inspecting the pattern formed on the EUV mask, and the arrangement direction of the EUV mask serving as the inspection substrate is matched with the relation between the incident direction of the EUV light on the EUV mask, and the arrangement direction of the EUV mask in the EUV exposure apparatus; and a comparison processing circuit that compares the optical image acquired and a predetermined reference image.

According to another aspect of the present invention, an electron beam inspection apparatus includes:

a storage device that stores design data of a pattern to which is added exposure apparatus information indicating an arrangement direction of a target object in an exposure apparatus which illuminates a large circular arc of a few millimeter height and about 104 millimeter width which corresponds to the chip width on a substrate, on the desired region of the EUV mask with an EUV light in an incident angle of a predetermined direction and prints the pattern of the EUV mask in four or eight times reduction ratio to the target object using a reflected EUV light thereon in one direction by a movement of a mask stage to mount the EUV mask thereon in a direction being perpendicular to a plane including an incident direction and a reflection direction of the EUV light with respect to the EUV mask in the exposure apparatus and being parallel to a pattern forming surface of the EUV mask, and the incident direction of the EUV light to the EUV mask;

a setting processing circuit that reads the exposure apparatus information added to the design data from the storage device to set an arrangement direction of the target object in an electron beam inspection apparatus with respect to the scanning direction of the electron beam, based on a relation indicated by the exposure apparatus information;

an image acquisition mechanism that acquires a pattern image of the pattern exposed and printed onto the target object, by scanning the target object with the electron beam in a set arrangement direction of the target object; and a comparison processing circuit that compares an acquired optical image and a predetermined image.

According to yet another aspect of the present invention, a mask inspection method includes:

acquiring exposure apparatus information indicating an arrangement direction of an EUV (Extreme Ultraviolet) mask with a pattern formed thereon in an exposure apparatus which illuminates a large circular arc of a few millimeter height and about 104 millimeter width which corresponds to the chip width on a substrate, on the desired region of the EUV mask with an EUV light in an incident angle of a predetermined direction and prints the pattern of the EUV mask in four or eight times reduction ratio to a target object using a reflected EUV light thereon in one direction by a movement of a mask stage to mount the EUV mask thereon in a direction being perpendicular to a plane including an incident direction and a reflection direction of the EUV light with respect to the EUV mask in the exposure apparatus and being parallel to a pattern forming surface of the EUV mask, and the incident direction of the EUV light to the EUV mask;

disposing the EUV mask on a stage such that a relation between an incident direction of an inspection light used for inspecting the pattern formed on the EUV mask, and the arrangement direction of the EUV mask serving as an inspection substrate is matched with a relation between the incident direction of the EUV light on the EUV mask, and the arrangement direction of the EUV mask in the exposure apparatus, based on a relation indicated by the exposure apparatus information acquired;

acquiring an optical image of the pattern by making the inspection light incident on the EUV mask and detecting a reflection inspection light reflected from the EUV mask, in a state where the relation between the incident direction of the inspection light used for inspecting the pattern formed on the EUV mask, and the arrangement direction of the EUV mask serving as an inspection substrate is matched with the relation between the incident direction of the EUV light on the EUV mask, and the arrangement direction of the EUV mask in the EUV exposure apparatus; and comparing the optical image acquired and a predetermined reference image, and outputting a comparison result.

According to yet another aspect of the present invention, an electron beam inspection method includes:

storing, in a storage device, design data of a pattern to which is added exposure apparatus information indicating an arrangement direction of a target object in an exposure apparatus which illuminates a large circular arc of a few millimeter height and about 104 millimeter width which corresponds to the chip width on a substrate, on the desired region of the EUV mask with an EUV light in an incident angle of a predetermined direction and prints the pattern of the EUV mask in four or eight times reduction ratio to the target object using a reflected EUV light thereon in one direction by a movement of a mask stage to mount the EUV mask thereon in a direction being perpendicular to a plane including an incident direction and a reflection direction of the EUV light with respect to the EUV mask in the exposure apparatus and being parallel to a pattern forming surface of the EUV mask, and the incident direction of the EUV light to the EUV mask;

setting an arrangement direction of the target object in an electron beam inspection apparatus by reading the exposure apparatus information added to the design data from the storage device in order to set the scanning direction, based on a relation indicated by the exposure apparatus information;

acquiring a pattern image of the pattern exposed and printed onto the target object, by scanning the target object with the electron beam in a set arrangement direction of the target object; and comparing the optical image acquired and a predetermined image, and outputting a comparison result.

DETAILED DESCRIPTION OF THE INVENTION

A first embodiment describes a mask inspection apparatus and method that can inspect an EUV mask under the same condition as the case of exposing a pattern of an EUV mask in an exposure apparatus which utilizes a reflective optical system of EUV lithography while taking account of an effect of dimensional change resulting from a relation between a pattern and an incident light direction in the exposure apparatus. Moreover, the first embodiment describes an inspection apparatus and method that can highly accurately inspect, with electron beams, a pattern having been transferred by an EUV exposure apparatus.

First Embodiment

Figure 1:
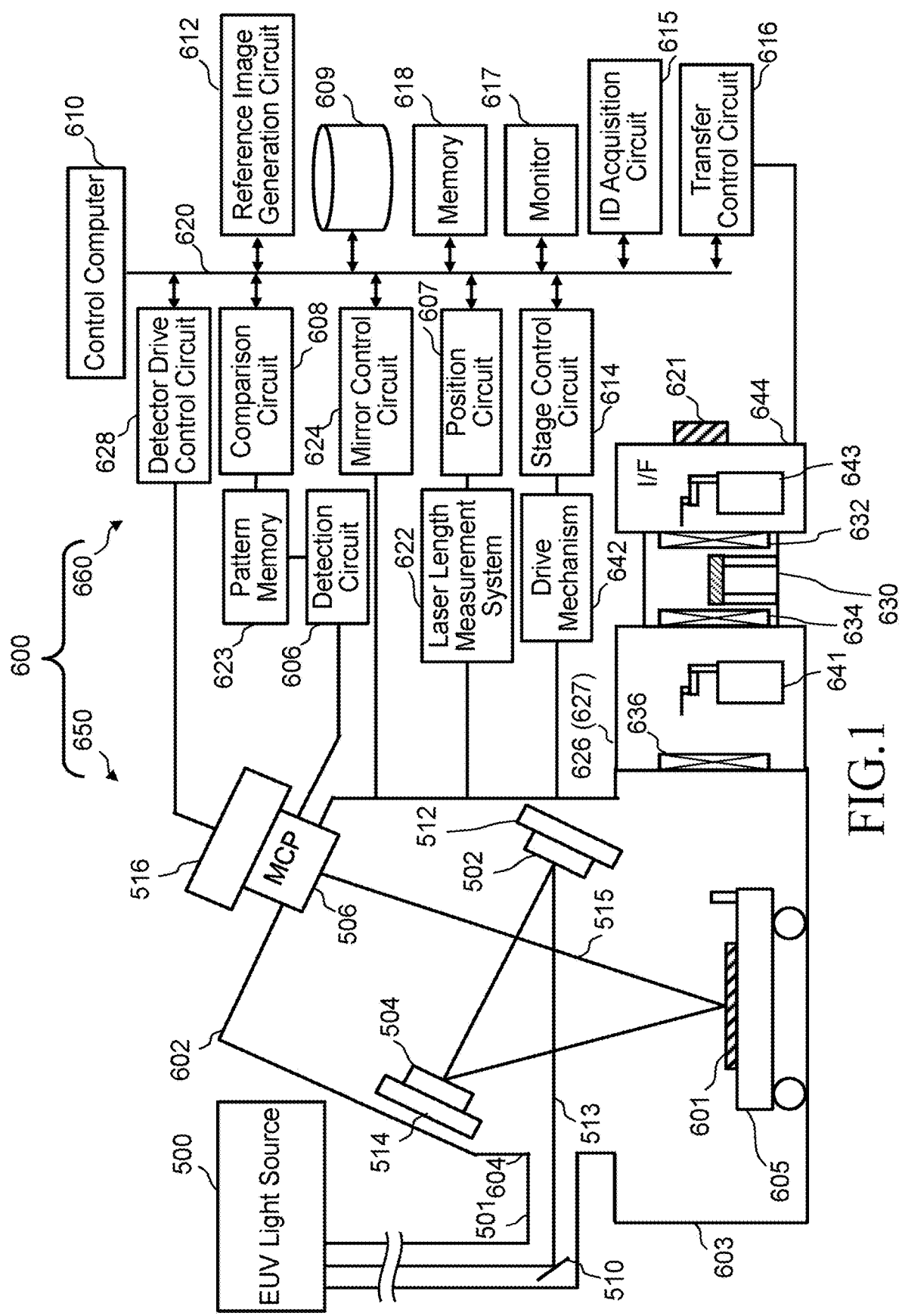
FIG. 1 shows a structure of a mask inspection apparatus according to a first embodiment.

FIG. 1 shows a structure of a mask inspection apparatus according to a first embodiment. In FIG. 1, a mask inspection apparatus 600 inspects defects of a pattern formed on an EUV (Extreme Ultraviolet) mask 601 (an example of a substrate to be examined). The mask inspection apparatus 600 is an example of an image acquisition apparatus. The mask inspection apparatus 600 includes an inspection image acquisition mechanism 650, an input/output management system 644, a load lock (L/L) chamber 630, a robot chamber 626, an alignment (ALN) chamber 627, and a control system circuit 660 (control unit).

The inspection image acquisition mechanism 650 includes an inspection optics chamber 602, an inspection stage chamber 603, a detection circuit 606, a pattern memory 623, a drive mechanism 642, and a laser interferometer system 622. In the inspection optics chamber 602, there are disposed mirrors 502 and 504, and a detector 506. A light entrance 604 for EUV light used as an inspection light is formed in the inspection optics chamber 602. A reflective optical system is configured by a plurality of mirrors 502 and 504.

In the input/output management system 644, there is disposed a transfer robot 643 for transferring the EUV mask 601 and a mask rotation stage (not shown) to adjust the arrangement direction of an EUV mask 601. In the robot chamber 626, there is disposed a transfer robot 641 for transferring the EUV mask 601. A reader 621 that can optically read an ID (identifier) pattern, to be described later, formed on the EUV mask 601 is disposed at the input/output management system 644. An alignment chamber 627 (not shown), in which there is disposed an alignment stage (not shown) for adjusting the position of the EUV mask 601 for transfer robot 641, is arranged at the other side of the robot chamber 626. The inside of the inspection optics chamber 602, the L/L chamber 630, the robot chamber 626, the ALN chamber 627, and the inspection stage chamber 603 is evacuated by respective vacuum pumps or a common one (not shown) to be controlled in a vacuum state of a predetermined pressure.

An XY stage 605 movable at least in the x-y plane is disposed in the inspection stage chamber 603. The EUV mask 601 to be inspected is attachably/detachably mounted on the XY stage 605. The EUV mask 601 is a mask for EUV exposure which exposes/transfers a mask pattern onto a semiconductor substrates, such as a wafer, etc. with an EUV light. The EUV mask 601 is attachably/detachably placed, with its pattern-forming surface facing upward, on the XY stage 605, for example. The XY stage 605 is freely movable in the plane parallel to a main pattern region surface. Moreover, on the XY stage 605, there is disposed a mirror 517 to measure the stage position with the laser interferometer system 622 arranged outside the inspection stage chamber 603.

A reflective optical system is configured by at least two multilayer mirrors. In the case of FIG. 1, the reflective optical system is composed of a plurality of mirrors 502 and 504. The reflective optical system leads a coherent EUV light led from a light source 500 (EUV light source) to the main pattern region of the EUV mask 601, and irradiates it at the same chief ray angle (about six degrees against the perpendicular direction to the mask surface) as that of the EUV exposure apparatus so as to be collected in the main pattern region. Specifically, a mirror 502 (first mirror) is configured by a multilayer mirror which reflects an EUV light, and arranged on a drive base 512. Then, the mirror 502 reflects an EUV light 513, incident through the light entrance 604, in a predetermined direction. The drive base 512 drives the mirror 502, and tunably adjusts the reflection direction (angle) of the mirror 502. A mirror 504 (second mirror) is configured by a multilayer mirror which reflects the EUV light 513, and arranged on a drive base 514. Then, the mirror 504 changes the direction of the EUV light 513 reflected from the mirror 502, and reflects it in a predetermined direction against the surface of the EUV mask 601. The mirror 504 provides irradiation at the same chief ray angle (about six degrees against the perpendicular direction to the mask surface) as that of the EUV exposure apparatus, and focuses the EUV light 513 onto a desired position in the main pattern region of the EUV mask 601 with the desired spot size. The drive base 514 drives the mirror 504, and tunably adjusts the reflection direction (angle) by the mirror 504 and the focal distance (focus). The detector 506 (EUV light detector) detects an EUV light 515 reflected from the surface of the EUV mask 601 where the reflection angle is set based on the angle of an incident light, and NA is set based on the distance from the EUV mask 601 and the area of the light receiving surface. For example, the detector 506 is configured using a CCD sensor, a CMOS sensor, or the like with sensitivity to an EUV light, and arranged on the drive base 516. As long as the light receiving surface of the detector 506 is arranged in the inspection optics chamber 602, the other part of the detector 506 may be arranged outside the inspection optics chamber 602. The detector 506 receives the EUV light 515 reflected from the EUV mask 601, and detects an intensity distribution of the diffracted (reflected) EUV light 515. The drive base 516 drives the detector 506, and tunably adjusts the focal distance between the EUV mask 601 for receiving, based on a preset NA, the EUV light 515 reflected from the EUV mask 601, and the light receiving surface of the detector 506. The detector 506 is connected outside the inspection optics chamber 602 to the detection circuit 606. The detection circuit 606 is connected to the pattern memory 623.

In the control system circuit 660, a control computer 610 which controls the whole of the mask inspection apparatus 600 is connected, through a network 620, to a position circuit 607, a comparison circuit 608, a reference image generation circuit 612, a stage control circuit 614, an ID acquisition circuit 615, a transfer control circuit 616, a mirror control circuit 624, a detector drive control circuit 628, a storage devices 609 such as a magnetic disk drive, a monitor 617, and a memory 618.

The pattern memory 623 is connected to the comparison circuit 608. The XY stage 605 is driven by the drive mechanism 642 under the control of the stage control circuit 614. The stage control circuit 614 (stage control unit) highly accurately controls the position of the XY stage 605. In the drive mechanism 642, a drive system such as a two (x-, and y-) axis motor which provides drive in the x and y directions is configured, and can move the XY stage 605. The movement position of the XY stage 605 is measured by the laser interferometer system 622, and supplied (transmitted) to the position circuit 607. Based on the principle of laser interferometry, the laser interferometer system 622 measures the displacement of the XY stage 605 precisely used by the interference between an incident laser beam and a reflected laser beam from the mirror 517. The mirror 502 is driven by the drive base 512 under the control of the mirror control circuit 624. The mirror 504 is driven by the drive base 514 under the control of the mirror control circuit 624. The detector 506 is driven by the drive base 516 under the control of the detector drive control circuit 628.

Design pattern data (writing data) used as a basis of pattern formation of the EUV mask 601 is input from the outside of the inspection apparatus 600, and stored in the storage devices 609 such as a magnetic disk drive.

The transfer control circuit 616 controls and drives the input/output management system 644, the L/L chamber 630, the robot chamber 626, and each device in the ALN chamber 627, which configure a transfer system. An ID pattern read by the reader 621 is output to the ID acquisition circuit 615.

The coherent EUV light 513 emitted from the light source 500 arranged outside the mask inspection apparatus 600 is incident on the inspection optics chamber 602 from the light entrance 604 of the inspection optics chamber 602 through the optical system 510 in a beam tube 501. For example, the coherent EUV light 513 is parallelly incident on the surface of the EUV mask 601. In the light source 500, there are disposed several magnets for bending the trajectory of electrons, a large sized equipment (about five to twenty meters in diameter), larger than the mask inspection apparatus 600, for confining electrons, and an accelerator (about several meters in length) for inputting electrons, for example.

The EUV light used in the EUV exposure apparatus and the like is obtained from a high-temperature and high-density plasma light. For example, the EUV light is obtained from plasma light emitted by applying a strong laser beam to a specific substance (e.g., Sn). When generating plasma light by exciting a specific substance with a laser, plasma light whose output is corresponding to an input laser power is obtained. In order to obtain a plasma light source with a high brightness (luminance) by continuously and focusingly applying a specific substance used as a target to be irradiated with a high power laser, the substance is maintained in liquid form and its size is controlled to be emitted in a pulse state. A substance quickly excited by a laser is expanded and ionized to generate a plasma. The substance after plasma emission can be removed, if it has been ionized, by reductive atmosphere by strong magnetism and hydrogen. However, if the substance is neutralized, it is deposited as a residue (debris) in the atmosphere. The generated plasma light is led by a multilayer mirror which selectively reflects an EUV light with a wavelength of 13.5 nm so as to form a focal point (light source) of EUV lights. In the light source 500 according to the first embodiment, for example, it is not necessary to generate plasma light, and preferable to use a coherent light generated by a synchrotron light source which directly uses an X-ray generated in the tangent direction of the trajectory when the electron trajectory is bent. However, it is not limited thereto. It is also preferable to use a light source similar to the EUV light source used in the EUV exposure apparatus, etc. Although the synchrotron light source is used here as an example of the EUV light source 500, it is not limited thereto. What is necessary is an EUV light source that outputs a coherent EUV light 513.

The coherent EUV light 513 from the light source 500, which was incident in parallel to the surface of the EUV mask 601, is reflected from the mirror 502, further reflected from the mirror 504, and enters the EUV mask 601 having been moved by movement of the XY stage 605, at a preset chief ray angle (angle in the case of an EUV light entering the EUV mask 601 by an EUV exposure apparatus). The EUV light 515 reflected from the EUV mask 601 by irradiation with the EUV light 513 is detected by the detector 506.

FIG. 1 shows configuration elements necessary for describing the first embodiment. It should be understood that other configuration elements generally necessary for the mask inspection apparatus 600 may also be included therein.

Figure 2:
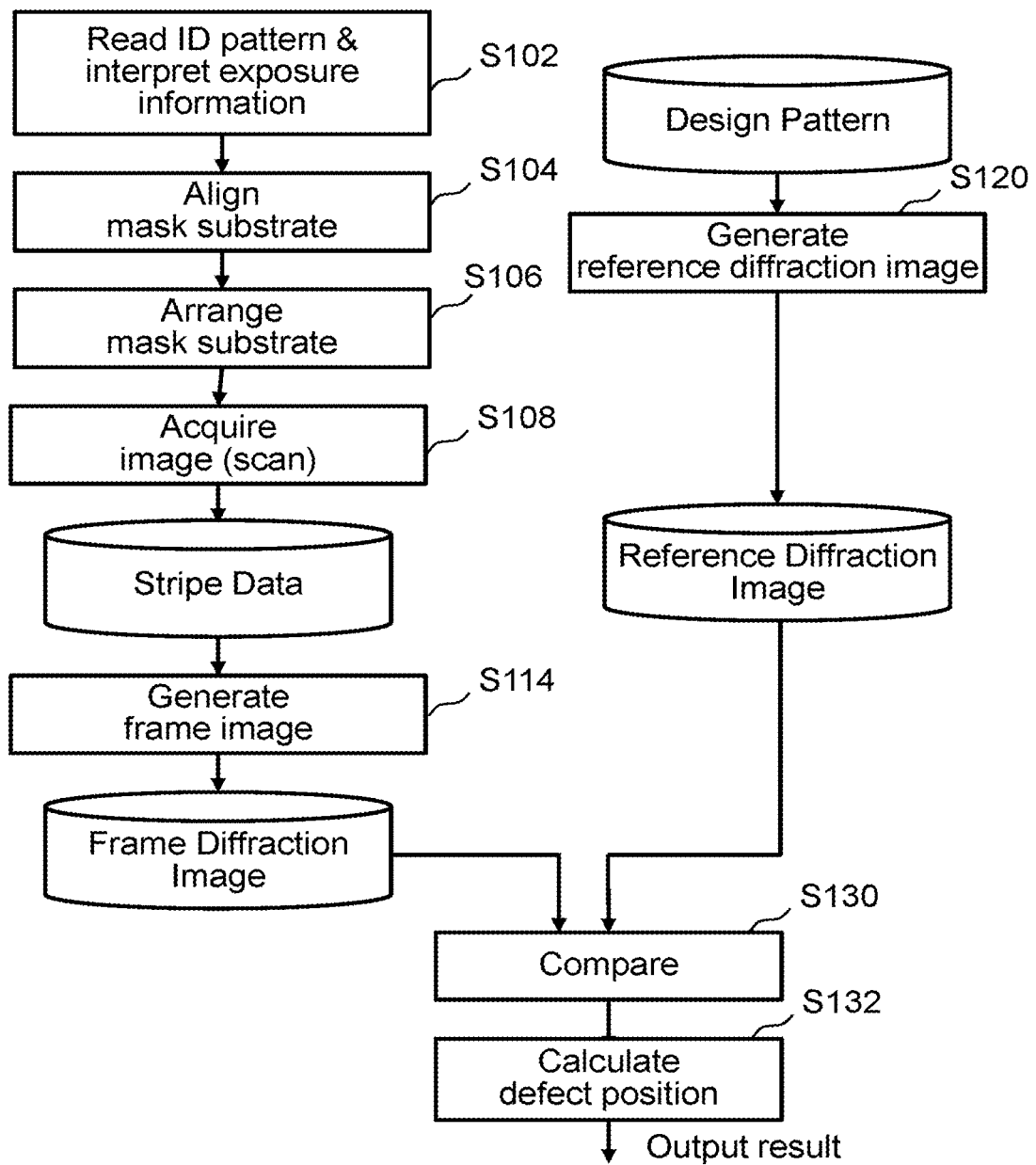
FIG. 2 is a flowchart showing main steps of a mask inspection method according to the first embodiment.

FIG. 2 is a flowchart showing main steps of a mask inspection method according to the first embodiment. In FIG. 2, the mask inspection method of the first embodiment executes a series of steps: an ID pattern read & exposure information interpretation step (S102), a mask alignment step (S104), a mask arrangement step (S106), an image acquisition (scan) step (S108), a frame image generation step (S114), a reference diffraction image generation step (S120), a comparison step (130), and a defect position calculation step (S132).

Figure 3:
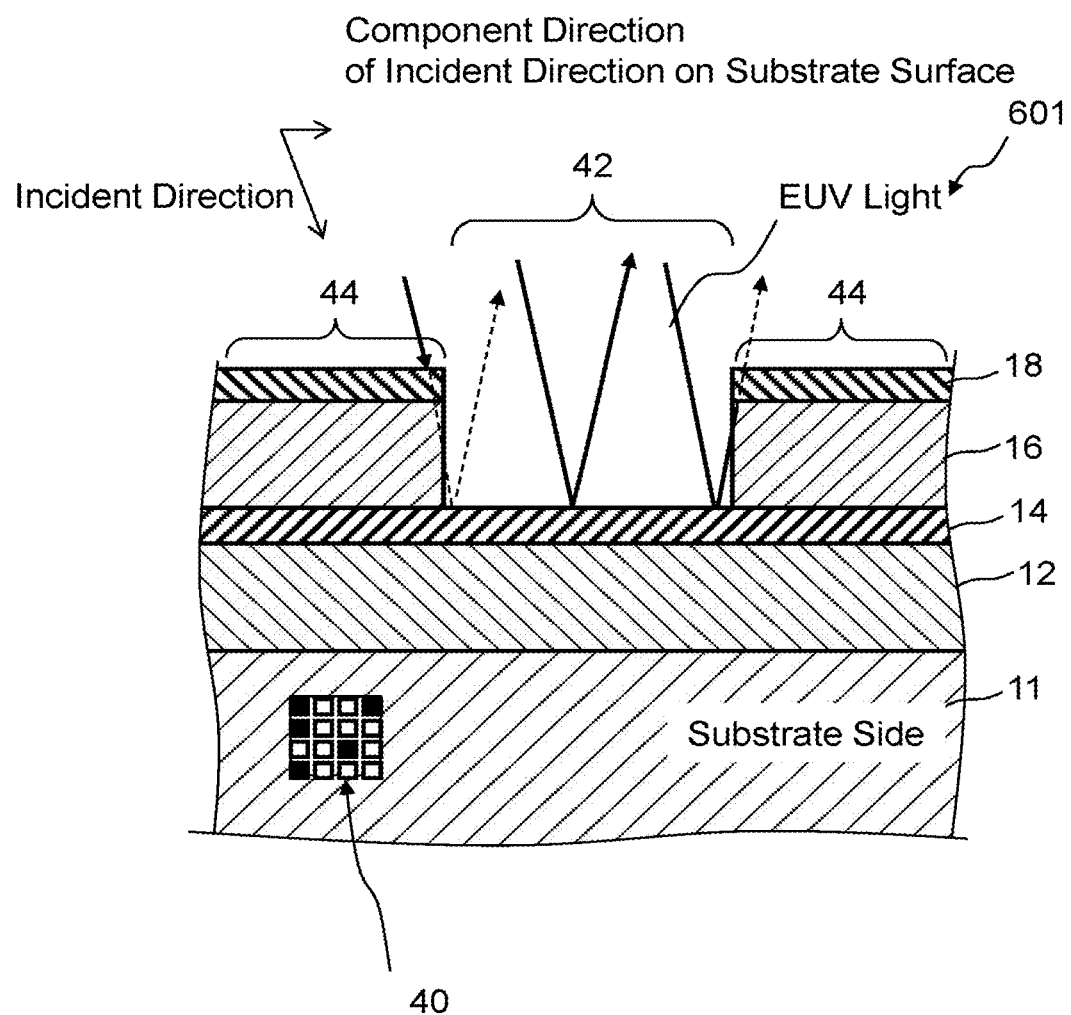
FIG. 3 is a sectional view showing an example of a part of an EUV mask according to the first embodiment.

FIG. 3 is a sectional view showing an example of a part of an EUV mask according to the first embodiment. In the EUV mask 601 of FIG. 3, a reflection type mask is configured by forming a multilayer film 12 on a low thermal expansion glass substrate 11, for example. The multilayer film 12 formed by alternately layering molybdenum (Mo) and silicon (Si), for example, is used. Since the multilayer film 12 may be damaged under the patterning process environment of the EUV mask, a cap film 14 is formed on the whole surface of the multilayer film 12, as a protective layer penetrating an EUV light such as ruthenium (Ru) and being durable to the patterning process environment. On the multilayer film 12 of the EUV mask 601 (on the cap film 14 in the case of FIG. 3), an absorber film 16 having a sufficient film thickness (e.g., about 70 nm in the case of Ta-based alloy) for absorbing an EUV light is formed. An antireflection film 18 against Out of band light which may be sensitive to the resist on a substrate like wafer, is formed on the absorber film 16. A pattern is formed by removing a portion corresponding to a chip pattern configured by a plurality of figure patterns from the absorber film 16 and antireflection film 18 by etching process, etc. A region 42 where a pattern has been formed reflects EUV lights since the cap film 14 is exposed, for example. On the other hand, a region 44 where no pattern has been formed hardly reflects EUV lights since the absorber film 16 which absorbs EUV lights remains on the cap film 14.

As described above, in the EUV mask 601, the absorber film 16 for absorbing an EUV light is needed. For example, in the case of Ta-based alloy, film thickness of about 70 nm is needed for obtaining a sufficient light blocking effect. On the other hand, with respect to a pattern to be transferred, if the critical dimension of about 18 nm on the wafer is required which is resolvable in the case of wavelength of 13.5 nm, NA 0.33, and process factor (k1) 0.45, the critical dimension of a pattern to be transferred through the optics in four times reduction ratio is the critical dimension of about 72 nm on the EUV mask, and the aspect ratio is 1:1. Therefore, when an EUV light diagonally illuminates the EUV mask 601 (at the chief ray angle of about six degrees against the perpendicular direction to the mask surface), a part of the EUV light is absorbed (dotted line) because the pattern of the absorber film 16 having a film thickness of 70 nm and formed three-dimensionally becomes a barrier on the incident path, depending on the incident direction of the EUV light. Because of shadow of the absorber film 16, the light amount of the EUV light to be transferred to the wafer is attenuated. Due to the influences of the shadow (mask 3D effect), the critical dimension of the pattern to be transferred to the wafer by the EUV exposure apparatus may change. Thus, with respect to the exposure apparatus actually using a reflective optical system in the EUV lithography by using the EUV mask 601, if not considering whether or not the light absorbing pattern formed on the EUV mask has been transferred in consideration of the influence of critical dimension change occurred from the relation between the pattern written on the EUV mask and the direction of the EUV light incident on the EUV mask, there may be a critical dimension difference between the image acquired by a reflected light obtained by irradiating the EUV mask of the exposure apparatus with an EUV light, and the pattern on the image obtained from the EUV mask 601 of the mask inspection apparatus 600. Therefore, there may be a problem where correlation cannot be obtained between a defect detected in the mask inspection apparatus 600 and a defect transferred by the actual exposure apparatus.

Since the exposure wavelength is shorter in EUV lithography, the resolution becomes better than that of the immersion lithography using a DUV light. In the immersion lithography, the resolution has been improved by pattern design optimization by DFM (Design for Manufacturing) and process enhancement techniques. The resolution close to the physical limit has been obtained by arranging the direction of patterns in one dimension, and applying a special super resolution enhancement technique, such as the double exposure or the double patterning. Meanwhile, the method is becoming mainstream in which a transistor circuit is configured by dividing a one-dimensional line and space pattern used in the immersion lithography, and connecting the upper and lower layers with a contact hole pattern. In the EUV lithography, although complicated wiring is originally required, the range of circuit selection may increase to a two-dimensional pattern which can make the area of a chip smaller than one-dimensional pattern. However, since the reliability of the EUV lithography has not been thoroughly acquired, and the development cost and the development period associated with circuit design change are large, circuit design of one-dimensional patterns is still in main use. Therefore, even when the EUV lithography has become to be employed, one-dimensional patterns are to be continued probably as the lithography technology. In a one-dimensional pattern, the line pattern and the space pattern are repeatedly arranged in the same direction. A transistor circuit is configured by dividing such a pattern and connecting up and down.

Figure 4:
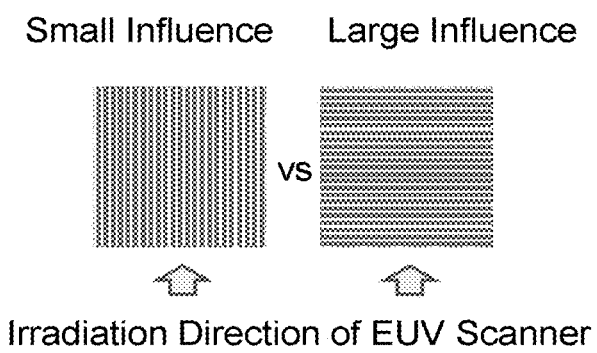
FIG. 4 illustrates a relation between an irradiation direction of an EUV exposure apparatus and an arrangement direction of a one-dimensional pattern according to the first embodiment.

FIG. 4 illustrates a relation between an irradiation direction of an EUV exposure apparatus and an arrangement direction of a one-dimensional pattern according to the first embodiment. FIG. 4 shows a line and space pattern as a one-dimensional pattern. In FIG. 4, if the irradiation direction of the EUV exposure apparatus (EUV scanner) and the line and space pattern are vertical to each other, the influence of the shadow described above (mask 3D effect) is large. On the other hand, if the irradiation direction of the EUV exposure apparatus and the line and space pattern are parallel to each other, the shadow described above (mask 3D effect) does not affect, or its influence is small. In addition, there are cases of transferring an edge defect and of not transferring it. For example, if, in the line and space, there is a small rectangular concave defect (mouse bite type defect) which loses a part of the absorber pattern on the pattern side and whose size is approximately a half (35 nm) of the film thickness in width and depth and total film thickness (70 nm) in height, when the EUV light irradiates the absorber pattern in parallel, it becomes a shadow by mask 3D effect, thus, not to be exposed onto the wafer. However, if it is incident perpendicularly on the absorber pattern, a mouse bite type defect of 35 nm may be transferred.

Figure 5:
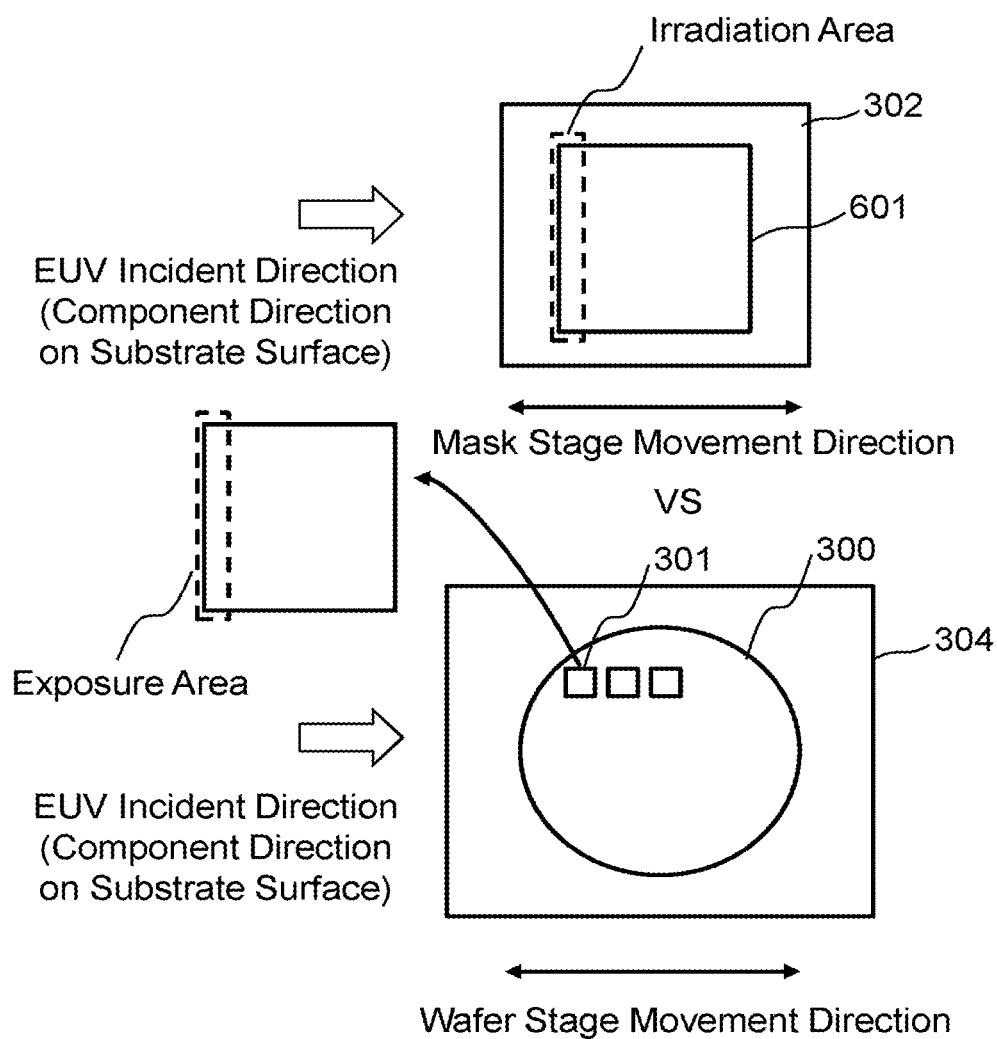
FIG. 5 illustrates scanning directions of a mask stage and a wafer stage of an EUV exposure apparatus according to the first embodiment.

FIG. 5 illustrates scanning directions of a mask stage and a wafer stage of an EUV exposure apparatus according to the first embodiment. In the EUV exposure apparatus (not shown), an EUV light is incident on the EUV mask 601 with a pattern formed thereon from a predetermined direction (at a chef ray angle of about six degrees against the perpendicular direction to the substrate surface), and pattern information is transferred to the wafer (target object) with a reflected EUV light from the EUV mask 601. In the EUV exposure apparatus, the EUV mask 601 is disposed on a mask stage 302. A wafer 300 used as an exposure target is disposed on a wafer stage 304. In the EUV exposure apparatus, the first irradiation area of EUV mask 601 on the mask stage 302 is exposed with the irradiation area of an EUV light with a large circular arc of a few millimeter height and about 104 millimeter (Dashed line area) which corresponds to the chip width on the EUV mask. By moving the mask stage 302 in one direction, it becomes possible to irradiate all the patterns on the EUV mask 601 fixed to because the mask stage 302. A reflected EUV light having pattern information on an EUV mask is exposed in four or eight times reduction ratio to the first exposure area of one chip 301 formed in the wafer 300 on the wafer stage 304 which moves synchronizingly with the mask stage 302 with respect to the irradiation area of an EUV light with a large circular arc of about a millimeter height and about 26 millimeter which corresponds to the chip width on a substrate. By repeating this operation, the pattern for one chip formed on the EUV mask 601 is exposed and printed to the regions for a plurality of chips of the wafer 300.

In order to match the critical dimension of a pattern on an EUV mask to be transferred to the wafer by the EUV exposure apparatus with the critical dimension of a pattern of the EUV mask to be detected by the mask inspection apparatus 600, what is necessary is to take account of an influence of shadow of the absorber film 16 of the EUV mask by adjusting the relation between the incident direction of an EUV light on the EUV mask, and the arrangement direction of a pattern. In the EUV exposure apparatus, the chief ray angle of an EUV light is about six degrees against the perpendicular direction to the EUV mask surface, and the advancing direction of the irradiation region of an EUV light with a large circular arc of a few millimeter height and about 104 millimeter (Dashed line area) which corresponds to the chip width on the EUV mask 601, and the movement direction of the mask stage 302 and the wafer stage 304 are parallel and reverse to each other. Then, according to the first embodiment, the relation, in the EUV exposure apparatus, between the arrangement direction of the EUV mask 601 and an irradiation direction to the EUV mask 601 with an EUV light thereon is utilized.

According to the first embodiment, in the EUV exposure apparatus, an identifier (ID) pattern (identification pattern) for identifying exposure apparatus information which indicates a relation between the arrangement direction of the EUV mask 601 and the irradiation direction of the EUV mask 601 mounted on the stage 302 thereon is formed outside the main pattern region (exposing and transferred to a substrate) of the EUV mask 601. In the case of FIG. 3, an ID pattern 40 is formed in advance on the side surface of the glass substrate 11 of the EUV mask 601 which serves as a target to be inspected, for example. Not limited to the side surface of the glass substrate 11 of the EUV mask 601, it is also preferable to form the ID pattern 40 in advance in the periphery at the outside of the exposure area on the pattern surface of the EUV mask, or on the back surface of the glass substrate 11. As the ID pattern 40, it is preferable to use a bar code, or a QR Code (registered trademark), for example. However, it is not limited thereto. Other figure patterns may also be used.

In the ID pattern read & exposure information interpretation step (S102), in the EUV exposure apparatus, an acquisition mechanism acquires exposure apparatus information indicating a relation between the arrangement direction of the exposed pattern of an EUV mask 601 and the irradiation direction of the EUV light to the EUV mask 601 mounted on the mask stage 302 thereon. Specifically, it operates as follows: When the EUV mask 601 is set to the input/output management system 644, the reader 621 reads the ID pattern 40 from the EUV mask 601. The ID acquisition circuit 615 inputs and acquires the read ID pattern 40 from the reader 621. Then, the ID acquisition circuit 615 acquires the exposure apparatus information by interpreting the read ID pattern 40. The ID acquisition circuit 615 and the reader 621 are examples of an acquisition mechanism. In the exposure apparatus, the whole surface of the EUV mask 601 is irradiated (scanned) with EUV lights whose the chief ray angle of the incident direction is fixed, in the direction being perpendicular to the plane including the incident direction and a reflection direction of EUV lights with respect to the EUV mask 601 and being parallel to the pattern surface of the EUV mask 601.

In the mask alignment step (S104), after the reader 621 reads the ID pattern 40, the arrangement direction of the EUV mask 601 set to the input/output management system 644 is adjusted. Specifically, the direction is adjusted by a mask rotation stage (not shown) so that the incident direction of the EUV light 513 on the EUV mask 601 in the inspection stage chamber 603, and the arrangement direction of the EUV mask 601 may be matched with the relation between the incident direction of an EUV light on the EUV mask 601 in the EUV exposure apparatus and the arrangement direction of the EUV mask 601. Then, a gate valve 632 is opened, and the EUV mask 601 is transferred by the transfer robot 643 onto the support member in the L/L chamber 630. After the gate valve 632 is closed, the inside of the L/L chamber 630 is evacuated to a vacuum atmosphere by a vacuum pump (not shown). Next, after a gate valve 634 is opened, the EUV mask 601 disposed on the support member in the L/L chamber 630 is transferred, through the robot chamber 626, to the stage in the alignment chamber 627 by the transfer robot 641.

In the mask arrangement step (S106), mask alignment is performed for the EUV mask 601 for a fine adjustment of the final position. Next, after the gate valve 636 is opened, the EUV mask 601 disposed on the stage in the alignment chamber 627 is transferred, through the robot chamber 626, to the inspection stage chamber 603 by the transfer robot 641. Then, the transfer robot 641 disposes the aligned EUV mask 601 on the XY stage 605.

In the image acquisition (scan) step (S108), the inspection image acquisition mechanism 650 (image acquisition mechanism) acquires an optical image of a pattern irradiated by the EUV light 513, serving as an inspection light, incident on the EUV mask 601, and detecting the EUV light 515, serving as a reflection inspection light reflected from the EUV mask 601, in the state where the relation between the incident direction of an inspection light, which is used when inspecting a pattern formed on the EUV mask 601, on the EUV mask 601 and the arrangement direction of the EUV mask 601 is matched with the relation between the incident direction of an EUV light on the EUV mask 601 in the EUV exposure apparatus and the arrangement direction of the EUV mask 601.

Figure 6:
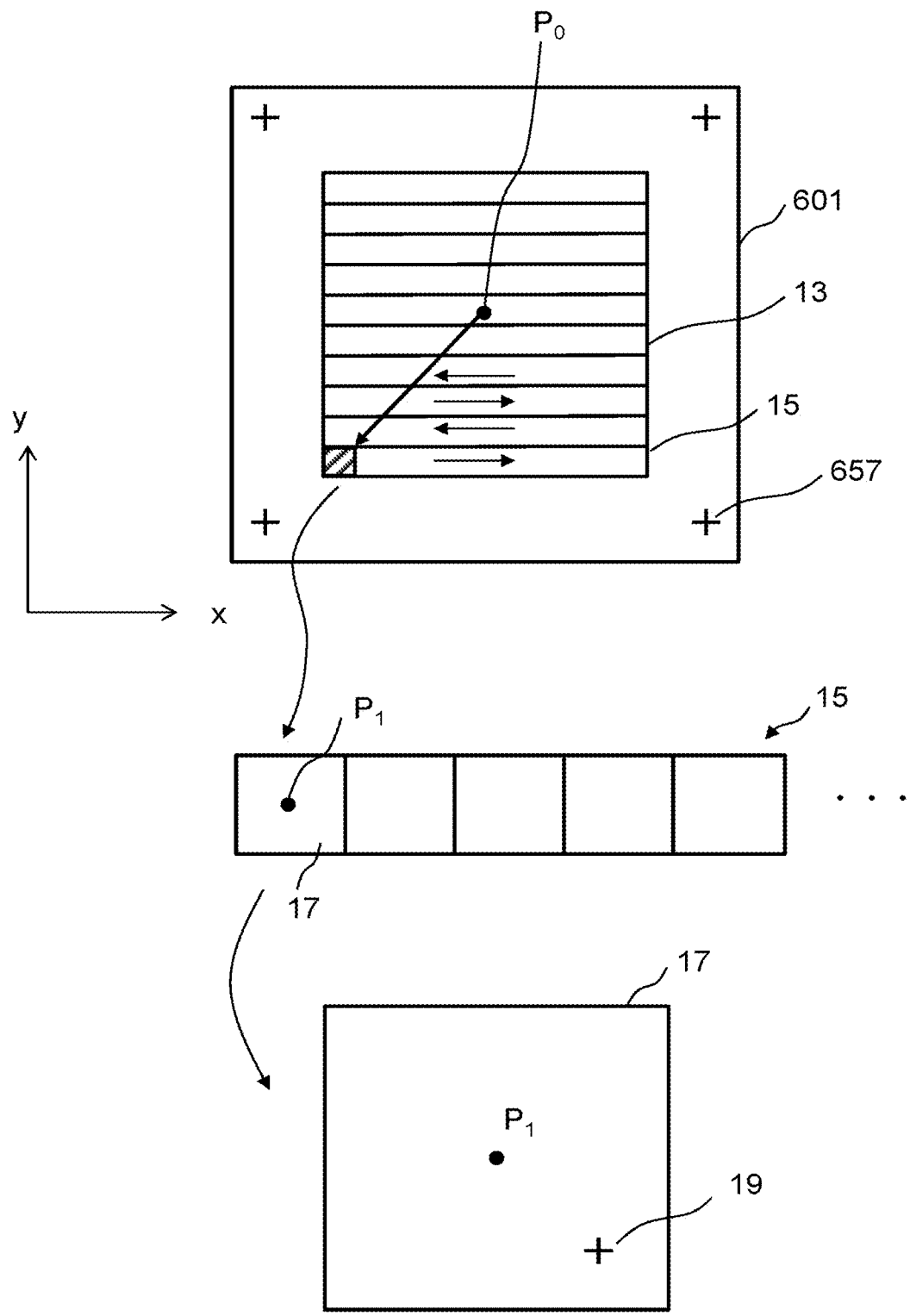
FIG. 6 illustrates an inspection region according to the first embodiment.

FIG. 6 illustrates an inspection region according to the first embodiment. In FIG. 6, four alignment marks 657 are formed corresponding to the four corners of the EUV mask 601, for example. In the EUV mask 601, a chip pattern positioned (aligned) by a plurality of these alignment marks 657 is formed in a main pattern region 13 by a writing apparatus (not shown). First, a pattern center coordinate P0 is set based on the position of each alignment mark 657. In FIG. 6, when acquiring an image of a chip pattern formed on the surface of the EUV mask 601, the control computer 610 divides the main pattern region 13 of the EUV mask surface 601 into a plurality of stripe regions 15 in a strip form by the size in the y direction that can be irradiated with the EUV light 513. While moving the XY stage 605, the inspection image acquisition mechanism 650 acquires, for each stripe region 15, a diffraction image of each stripe. Then, the diffraction image of each stripe is divided into images of a plurality of frame regions 17 by the size in the x direction which is, for example, the same as the size in the y direction in order to be compared, for each frame region 17, with a reference diffraction image. Therefore, alignment for image comparison is performed between images in the same frame region 17. Accordingly, the center position (coordinate center) P1 of each frame region is calculated. The center coordinate P1 of each frame region 17 is set based on vector coordinate from the pattern center coordinate P0. A specific operation of the method of acquiring an inspection image is described below.

While moving the XY stage 605, the inspection image acquisition mechanism 650 acquires a diffraction image included in each stripe, for each stripe region 15. Specifically, it operates as follows: First, when acquiring a signal of the reflected EUV light 515 by the detector 506 (EUV light detector), the stage control circuit 614 moves the XY stage 605 so that the main pattern region 13 of the EUV mask 601 may be irradiated with the EUV light 513. Then, the main pattern region 13 of the EUV mask 601 is selectively irradiated with a coherent EUV light led from the light source 500, by the reflective optical system configured by at least two multilayer mirrors. Specifically, it operates as follows: The reflective optical system such as the mirrors 502 and 504, which can adjust the direction of an EUV light and the spot size (that can be irradiated with the EUV light 513), leads the coherent EUV light 513 emitted from the EUV light source 500 to the main pattern region 13 of the EUV mask 601 through the two multilayer mirrors in order to perform irradiation diagonally at a predetermined chief ray angle in 5.5 to 6.5 degrees to the line perpendicular to the same EUV mask 601 as that of the EUV exposure apparatus. More specifically, the inspection image acquisition mechanism 650 reflects the coherent EUV light 513 from the light source 500, which entered in parallel to the surface of the EUV mask 601, by the mirror 502, further reflects it by the mirror 504, and makes it incident on the EUV mask 601 moving by the XY stage 605, at the preset angle (predetermined chief ray angle between 5.5 and 6.5 degrees with respect to the line perpendicular to the EUV mask). The detector 506 detects the EUV light 515 reflected from the EUV mask 601 due to irradiation with the EUV light 513, where the reflection is performed at the angle symmetrical to the angle of the incident light in 5.5 to 6.5 degrees with respect to the perpendicular line. In other words, the detector 506 (EUV light detector) detects the EUV light 515 reflected from the surface of the EUV mask 601 by irradiating the surface of the EUV mask 601 with the EUV light 513 having a predetermined incident angle. In that case, the detector 506 detects an EUV light reflected from the main pattern region 13.

Figure 7:
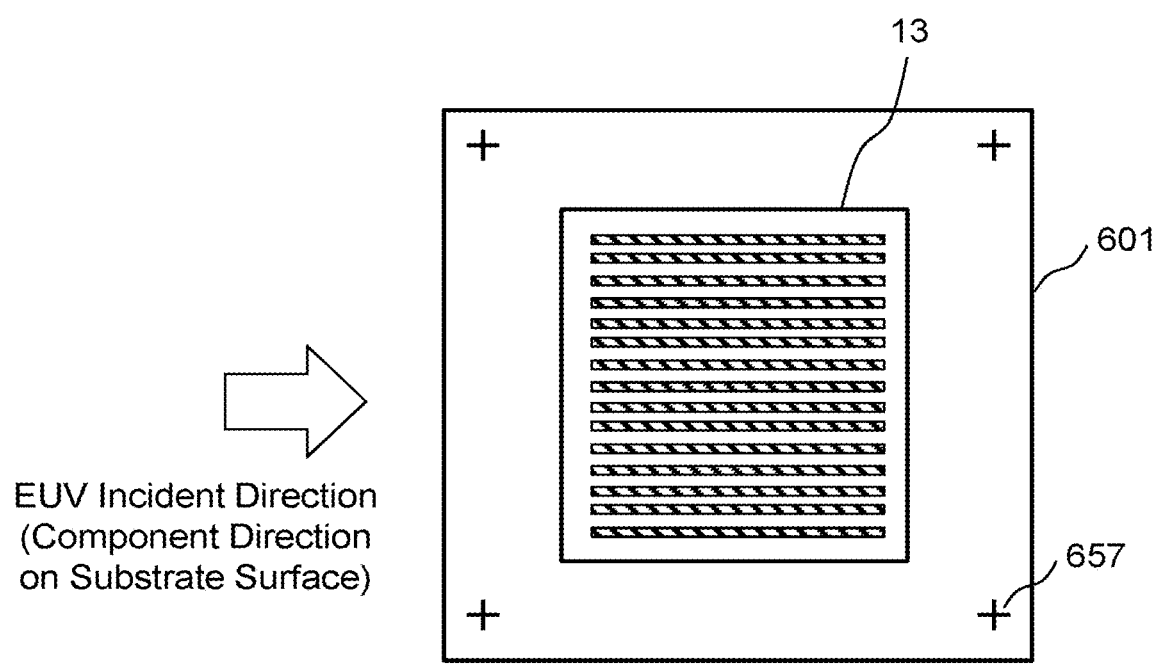
FIG. 7 shows an example of a relation between an EUV mask and an incident direction of an inspection light according to the first embodiment.

FIG. 7 shows an example of a relation between an EUV mask and an incident direction of an inspection light according to the first embodiment. In the case of FIG. 7, a line and space pattern extending horizontally in the figure is shown, as a chip pattern, with respect to the arrangement direction (e.g., vertical in the figure) serving as the reference of the EUV mask 601. If, in the EUV exposure apparatus, the incident direction of an EUV light on the EUV mask 601 is vertical to the arrangement direction serving as the reference of the EUV mask 601, scanning is performed for the XY stage 605 such that, in the mask inspection apparatus 600, similarly, the incident direction of the EUV light 513 (inspection light) on the EUV mask 601 is vertical to the arrangement direction serving as the reference of the EUV mask 601. Thereby, the EUV light 513 irradiates in parallel to the extending direction of a one-dimensional pattern. Therefore, in the case of FIG. 7, it is a condition under which influence of shadow by mask 3D effect is small. If a line and space pattern extending vertically in the figure is arranged, as a chip pattern, with respect to the arrangement direction (for example, vertically in the figure) serving as the reference of the EUV mask 601, the EUV light 513 irradiates in the direction vertical to the extending direction of a one-dimensional pattern. In that case, it goes without saying that it is a condition under which influence of shadow by mask 3D effect is large.

Detected data (measured image) of the EUV light 515 detected by the detector 506 is output to the detection circuit 606 in order of measurement. In the detection circuit 606, the detected data in an analog form is converted into digital data by an A-D converter (not shown), and stored in the pattern memory 623. In this way, the inspection image acquisition mechanism 650 acquires, in order, a diffraction image in each stripe of a chip pattern formed on the EUV mask 601. With respect to a stripe region where no pattern exists on design data, it goes to the next stripe region through avoiding an image acquisition operation. Here, as described above, since the stripe image acquired using a coherent EUV light as an inspection light is diffracted and interfered by a pattern on the EUV mask 601, it is very difficult to accurately know the position of the edge of the pattern, based directly on the obtained diffraction image. Therefore, the detection circuit 606 detects a diffracted light as the EUV light 515 including pattern information. Accordingly, the detected image is acquired as a diffracted image not as a real space image whose figure pattern shape can be specified. Then, data of each stripe image (stripe diffraction image) is transmitted to the comparison circuit 608, with information indicating the position of each stripe from the position circuit 607. The position circuit 607 (position specification unit) specifies the place (position) irradiated with the EUV light, based on the center coordinate P1 of the pattern, and the stage position information on the XY stage 605, which is measured by a laser interferometer system 122 and moved based on control by the stage control circuit 614 (stage control unit). This irradiation position serves as position information in the detected data of the EUV light. As shown in FIG. 6, by associating the center coordinate P1 of a frame diffraction image (detected diffraction image) with detected data (diffracted image) in each stripe obtained by irradiating the EUV light 513, it becomes possible to reconstruct the whole pattern of the EUV mask with respect to the center coordinate P0, as a plurality of diffracted images.

Figure 8:
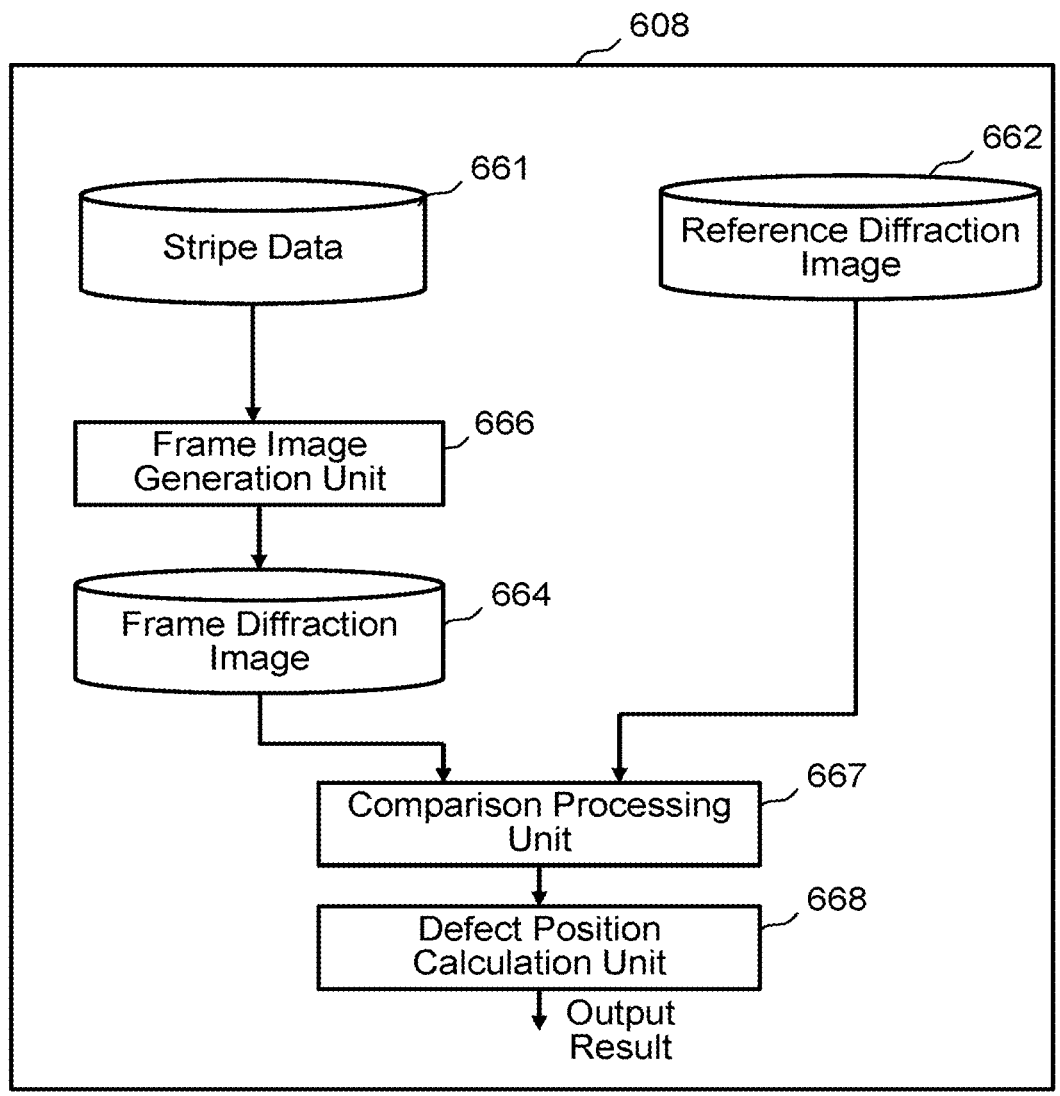
FIG. 8 is a block diagram showing the internal structure of a comparison circuit according to the first embodiment.

FIG. 8 is a block diagram showing the internal structure of a comparison circuit according to the first embodiment. In FIG. 8, in the comparison circuit 608, there are arranged storage devices 661, 662, and 664 such as magnetic discs, a frame image generation unit 666, a comparison processing unit 667, and a defect position calculation units 668. Each of the " . . . units" such as the frame image generation unit 666, the comparison processing unit 667, and the defect position calculation unit 668 includes processing circuitry. As the processing circuitry, for example, an electric circuit, computer, processor, circuit board, quantum circuit, or semiconductor device is used. Each " . . . unit" may use common processing circuitry (the same processing circuitry), or different processing circuitry (separate processing circuitry). Information input/output to/from the frame image generation unit 666, the comparison processing unit 667, and the defect position calculation unit 668, and information being operated are stored in a memory (not shown) or a memory 118 each time.

Stripe diffraction image data (stripe data) having been input to a comparison circuit 608 is stored in the storage device 661. The comparison circuit 608 (comparison unit) compares an acquired optical image with a predetermined reference image. In other words, the comparison circuit 608 compares a pattern image of the diffracted image of the detected EUV light and a reference image being the diffracted image of the pattern at the position irradiated with the EUV light, which is computationally generated from design data of the pattern.

In the frame image generation step (S114), the frame image generation unit 666 reads stripe diffraction image data from the storage device 661, and generates a frame diffraction image (detected diffraction image) of each frame region, corresponding to the center coordinate P1 of each frame region 17. By reading necessary detected data with respect to the frame region 17 on the EUV mask 601, it is possible to acquire a frame diffraction image of the frame region 17 whose center coordinate is P1. The generated frame diffraction image is stored in the storage device 664.

In the reference diffraction image generation step (S120), the reference image generation circuit 612 generates, as a reference image, a diffraction image of a pattern at the position irradiated with the EUV light, which is calculated from the pattern data of the EUV mask used for comparison inspection. In other words, the reference image generation circuit 612 generates, for each frame region 17, a reference diffraction image based on the design data being a basis for forming a chip pattern on the EUV mask 601. The generated reference diffraction image is stored in the storage device 662. With respect to the figure defined in the design pattern data, figure data expressed in binary values of the minimum unit (also called an address unit) used for expressing figures is stored, for example. Specifically, it operates as follows: First, the reference image generation circuit 612 reads design pattern data from the storage device 609 through the control computer 610, and Fourier-transforms the figure pattern defined in the read design pattern data and binarized for each frame so as to generate a diffraction image for each frame region 17. Image data of the generated reference diffraction image is output to the comparison circuit 608. The image data of the reference diffraction image having been input to the comparison circuit 608 is stored in the storage device 662.

In the comparison step (S130), the comparison processing unit 667 (comparison unit) compares a diffraction image acquired by the detector 506 with a reference diffraction image computationally generated by the reference image generation circuit 612 based on design data. Specifically, the comparison processing unit 667 compares a frame diffraction image (pattern image) of the detected EUV light 515 at the calculated frame region position with a reference diffraction image (reference image) generated based on the design data at the corresponding position. By aligning the center coordinate P1 of the frame diffraction image acquired based on positions of a plurality of alignment marks 657 with the center coordinate P1 of the reference diffraction image, even if the edge position and the like of a concrete figure pattern cannot be acquired from the image, alignment of diffraction images can be achieved highly accurately.

If a defect exists in a pattern in the frame region 17, when the region including a defect 19 is irradiated with the EUV light 513, diffraction image is obtained with the influence of the defect 19 in the detected frame diffraction image (detected diffraction image). Therefore, the acquired diffraction image is different from that in the case of there being no defect 19. The comparison processing unit 667 compares the detected diffraction image with the reference diffraction image, for each predetermined sampling interval, according to predetermined determination conditions, and determines whether or not there is a defect. As the determination conditions, for example, the detected diffraction image and the reference diffraction image are compared for each predetermined sampling interval according to a predetermined algorithm in order to determine whether there is a defect. For example, it is determined whether a difference between both the intensity values is larger than a determination threshold value, and if larger, it is determined that there is a defect.

In the defect position calculation step (S132), the defect position calculation unit 668 specifies a frame diffraction image (detected diffraction image) having been determined to be defective. As shown in FIG. 6, the center coordinate P1 of the frame diffraction image (detected diffraction image) is known. However, since this frame diffraction image shows whether or not there is a defect in the Fourier space, a further calculation is needed in order to directly associate this frame diffraction image with information indicating where and what kind of defect is formed in real space. Specifically, it is necessary to recover a real space image (with ptychography that solves the diffraction-pattern phase problem by interfering adjacent Bragg reflections coherently and thereby determining their relative phase) by performing inverse Fourier transform by using a frame diffraction image including the defect 19, and if needed, its peripheral images. Then, the defect 19 can be specified from a real space image.

With respect to a frame including a defect, a real space image of the defective portion, where the actual pattern can be recognized, is formed and checked based on a diffraction image having been acquired and an EUV diffraction image newly acquired, using ptychography and the like. Specifically, the EUV mask is scanned such that a diffraction image is acquired per frame unit which is half the size of the region to be irradiated with an EUV light in the inspection apparatus. Then, areal space image in which a pattern edge, etc. can be recognized is generated by applying intensity data of an EUV diffracted image whose obtained detection regions overlap each other to a modelled complex transmission function, and performing an iterative phase retrieval calculation of Fourier transform and inverse Fourier transform.

As described above, using the mask inspection apparatus 600 according to the first embodiment, it is possible to inspect the EUV mask 601 on which a absorber pattern has been written, taking account of a critical dimension change occurred from the relation between the pattern written on the EUV mask used in the exposure apparatus using a reflective optical system in the EUV lithography and the direction of the EUV light incident on the EUV mask.

Next, there will be described inspection of a substrate such as a wafer onto which a pattern of the EUV mask 601 has been exposed and printed by an EUV exposure apparatus. Although the case of using multiple beams as an electron beam is described, it is not limited thereto. It is also applied to the case of an inspection apparatus using a single beam.

Figure 9:
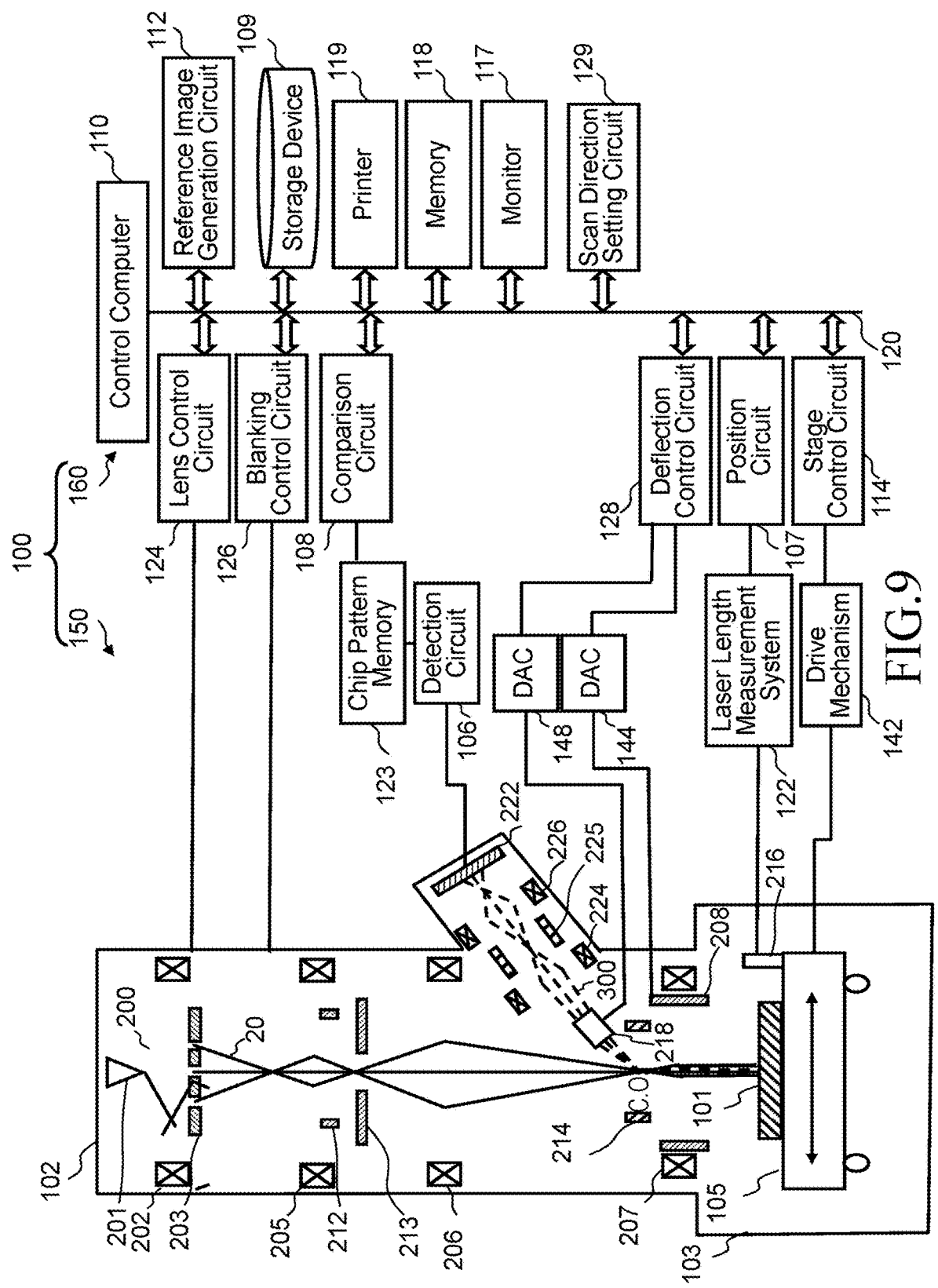
FIG. 9 is a block diagram showing an example of a configuration of an electron beam inspection apparatus according to the first embodiment.

FIG. 9 is a block diagram showing an example of a configuration of an electron beam inspection apparatus according to the first embodiment. In FIG. 9, an inspection apparatus 100 for inspecting patterns formed on a substrate 101 by using electron beams is an example of a multiple electron beam inspection apparatus. The inspection apparatus 100 includes an image acquisition mechanism 150 (secondary electron image acquisition mechanism) and a control system circuit 160. The image acquisition mechanism 150 includes an electron beam column 102 (electron optical column) and an inspection chamber 103. In the electron beam column 102, there are composed of an electron gun 201, an electromagnetic lens 202, an aperture array substrate 203, an electromagnetic lens 205, a common blanking deflector 212, a limiting aperture substrate 213, an electromagnetic lens 206, an electromagnetic lens 207, a beam deflector 208, a beam separator 214, an aberration compensator 218, an electromagnetic lens 224, a cancellation deflector 225, an electromagnetic lens 226, and a multi-detector 222.

A stage 105 movable at least in the x and y directions is disposed in the inspection chamber 103. The substrate 101 (target object) to be inspected is disposed on the stage 105. The substrate 101 may be a semiconductor substrate such as a silicon wafer onto which a pattern has been exposed by EUV exposure. A plurality of chip patterns (wafer dies) have been printed on the semiconductor substrate. The substrate 101 is placed with its pattern-forming surface facing upward on the stage 105, for example. Moreover, on the stage 105, there is disposed a mirror 216 to measure the stage position through the laser interferometer system 122 arranged outside the inspection chamber 103. The multi-detector 222 is connected, at the outside of the electron beam column 102, to a detection circuit 106.

In the control system circuit 160, a control computer 110 which controls the whole of the inspection apparatus 100 is connected, through a network 120, to a position circuit 107, the comparison circuit 108, a reference image generation circuit 112, a stage control circuit 114, a lens control circuit 124, a blanking control circuit 126, a deflection control circuit 128, a scan direction setting circuit 129, a storage device 109 such as a magnetic disk drive, a monitor 117, the memory 118, and a printer 119. The deflection control circuit 128 is connected to DAC (digital-to-analog conversion) amplifiers 144 and 148. The DAC amplifier 144 is connected to the beam deflector 208. The DAC amplifier 148 is connected to the cancellation deflector 225.

The detection circuit 106 is connected to a chip pattern memory 123. The chip pattern memory 123 is connected to the comparison circuit 108. The stage 105 is driven by a drive mechanism 142 under the control of the stage control circuit 114. In the drive mechanism 142, a drive system such as a two (x and y) axis motor which provides drive in the directions of x and y in the stage coordinate system is configured, and can move the stage 105 in the x and y directions. A step motor, for example, can be used as each of these x and y motors (not shown). The stage 105 is freely movable in the plane parallel to the substrate 101 (target object) by the x and y axis motors. The movement position of the stage 105 is measured by the laser interferometer system 122, and supplied (transmitted) to the position circuit 107. Based on the principle of laser interferometry, the laser interferometer system 122 measures the displacement of the stage 105 precisely used by the interference between an incident laser beam and a reflected laser beam from the mirror 216. In the stage coordinate system, the x and y directions are set with respect to a plane perpendicular to the optical axis (center axis of electron trajectory) of the multiple primary electron beams, for example.

The electromagnetic lenses 202, 205, 206, 207 (objective lens), 224 and 226, the beam separator 214 and the aberration compensator 218 are controlled by the lens control circuit 124. The common blanking deflector 212 is configured by two or more electrodes (or "two or more poles"), and each electrode is controlled by the blanking control circuit 126 through a DAC amplifier (not shown).

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to the applying the acceleration voltage, applying a voltage to another extraction electrode (Wehnelt) and heating the cathode to a predetermined temperature are performed, and thereby, electrons from the cathode are accelerated to be emitted as an electron beam 200.

FIG. 9 shows configuration elements necessary for describing the first embodiment. It should be understood that other configuration elements generally necessary for the inspection apparatus 100 may also be included therein.

Figure 10:
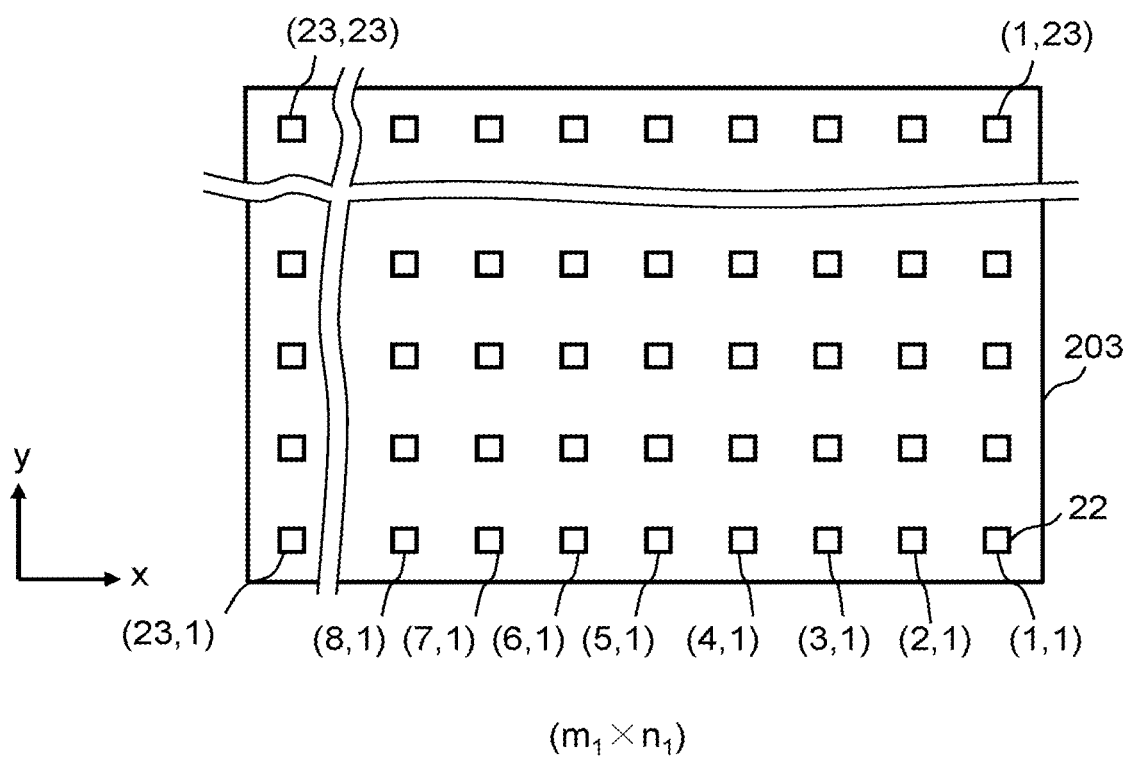
FIG. 10 is a conceptual diagram showing a configuration of an aperture array substrate according to the first embodiment.

FIG. 10 is a conceptual diagram showing a configuration of an aperture array substrate according to the first embodiment. As shown in FIG. 10, holes (openings) 22 of $m_1$ columns wide (width in the x direction) (each column in the y direction) and $n_1$ rows long (length in the y direction) (each row in the x direction) are two-dimensionally formed in the x and y directions at a predetermined arrangement pitch in the aperture array substrate 203, where one of $m_1$ and $n_1$ is an integer of 2 or more, and the other is an integer of 1 or more. In the case of FIG. 10, 23×23 holes (openings) 22 are formed. Multiple primary electron beams 20 are formed by letting portions of the electron beam 200 individually pass through a corresponding one of a plurality of holes 22.

Next, operations of the image acquisition mechanism 150 in the inspection apparatus 100 will be described below.

The electron beam 200 emitted from the electron gun 201 (emission source) is magnified by the electromagnetic lens 202, and illuminates the whole of the aperture array substrate 203. As shown in FIG. 10, a plurality of holes 22 (openings) are formed in the aperture array substrate 203. The region including all the plurality of holes 22 is irradiated by the electron beam 200. The multiple primary electron beams 20 are formed by letting portions of the electron beam 200, which irradiate the positions of a plurality of holes 22, individually pass through a corresponding one of the plurality of holes 22 in the aperture array substrate 203.

The formed multiple primary electron beams 20 are individually magnified and demagnified by the electromagnetic lenses 205 and 206, and travel to the electromagnetic lens 207 (objective lens) through the beam separator 214. Then, the multiple primary electron beams 20 is demagnified by the electromagnetic lens 207 and illuminates the substrate 101. The multiple primary electron beams are collectively deflected by the beam deflector 208 to irradiate respective beam irradiation positions on the substrate 101. When all of the multiple primary electron beams 20 are collectively deflected by the common blanking deflector 212, they deviate from the hole in the center of the limiting aperture substrate 213 and blocked by the limiting aperture substrate 213. On the other hand, the multiple primary electron beams 20 which were not deflected by the common blanking deflector 212 pass through the hole in the center of the limiting aperture substrate 213. Blanking control is provided by On/Off of the common blanking deflector 212 to collectively control On/Off of the multiple beams. Thus, the limiting aperture substrate 213 blocks the multiple primary electron beams 20 which were deflected to be in the "Off condition" by the common blanking deflector 212. Then, the multiple primary electron beams 20 for inspection (for image acquisition) are formed by the beams which have been made during a period from becoming "beam On" to becoming "beam Off" and have passed through the limiting aperture substrate 213.

When desired positions on the substrate 101 are irradiated with the multiple primary electron beams 20, a flux of secondary electrons (multiple secondary electron beams 300) including backscattered electrons each corresponding to each of the multiple primary electron beams 20 is emitted from the substrate 101 due to the irradiation by the multiple primary electron beams 20.

The multiple secondary electron beams 300 emitted from the substrate 101 travel to the beam separator 214 through the electromagnetic lens 207.

The beam separator 214 generates an electric field and a magnetic field to be vertical to each other in a plane perpendicular to the traveling direction of the center beam of the multiple primary electron beams 20, which is the electron trajectory central axis. The electric field affects (exerts force) in the same fixed direction regardless of the traveling direction of electrons. In contrast, the magnetic field affects (exerts force) according to Fleming's left-hand rule. Therefore, the direction of force acting on (applied to) electrons can be changed depending on the traveling (or "entering") direction of the electrons. With respect to the multiple primary electron beams 20 entering the beam separator 214 from the electron gun 201 side, with taking account of the beam position displacement by the force due to the electric field and the force due to the magnetic field, the multiple primary electron beams 20 travel straight downward. In contrast, with respect to the multiple secondary electron beams 300 entering the beam separator 214 from the substrate 101 side, since both the force due to the electric field and the force due to the magnetic field are applied to the opposite directions when incident electron beam direction being changed, the multiple secondary electron beams 300 are bent obliquely upward, and separated from the multiple primary electron beams 20.

The multiple secondary electron beams 300 having been bent obliquely upward and separated from the multiple primary electron beams 20 are further bent by the aberration compensator 218, and projected onto the multi-detector 222 through the electromagnetic lenses 224 and 226, and the cancellation deflector 225. The multi-detector 222 detects the projected multiple secondary electron beams 300. It is also preferable that backscattered electrons and secondary electrons are projected on the multi-detector 222, or that backscattered electrons having high energy are filtered by the beam separator 218 and remaining secondary electrons are projected. The multi-detector 222 includes a two-dimensional sensor. Each secondary electron of the multiple secondary electron beams 300 collides with a corresponding region of the two-dimensional sensor, and generates secondary electron image data for each pixel. In other words, in the multi-detector 222, a detection sensor is disposed for each primary electron beam i of the multiple primary electron beams 20, where i=1 to 529 in the case of the multiple primary electron beams 20 being composed of 23×23 beams. Then, the detection sensor detects a corresponding secondary electron beam emitted by irradiation with each primary electron beam i. Therefore, each of a plurality of detection sensors in the multi-detector 222 detects an intensity signal of a secondary electron beam for an image, which is resulting from irradiation with a corresponding primary electron beam i. The intensity signal detected by the multi-detector 222 is output to the detection circuit 106.

Figure 11:
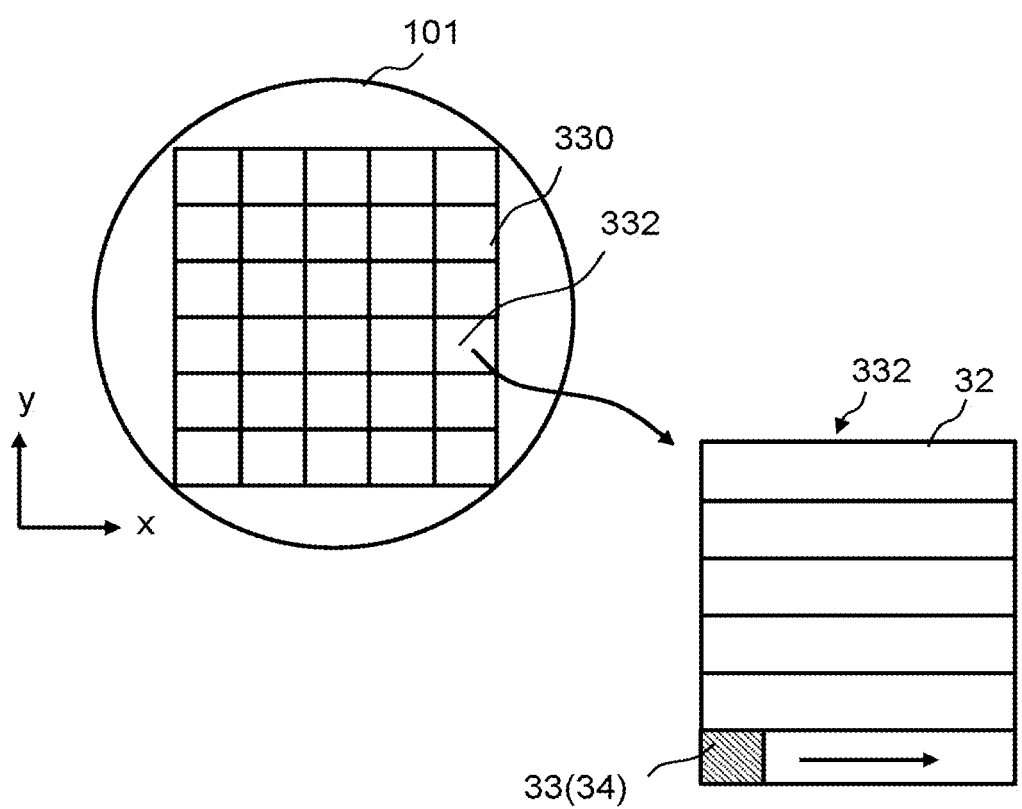
FIG. 11 shows an example of a plurality of chip regions formed on a semiconductor substrate, according to the first embodiment

FIG. 11 shows an example of a plurality of chip regions formed on a semiconductor substrate, according to the first embodiment. In FIG. 11, a plurality of chips (wafer dies) 332 in a two-dimensional array are formed in an inspection region 330 of the substrate 101 being a semiconductor substrate (wafer). A mask pattern for one chip formed on the EUV mask 601 is exposed and printed onto each chip 332 by an EUV exposure apparatus (EUV scanner) (not shown). The region of each chip 332 is divided into a plurality of stripe regions 32 by a predetermined width in the y direction, for example. The scanning operation by the image acquisition mechanism 150 is carried out for each stripe region 32, for example. The stage 105 is moved, for example, in the −x direction, so that the scanning operation of the stripe region 32 is relatively advanced in the x direction. Each stripe region 32 is divided into a plurality of frame regions 33 in the longitudinal direction.

Figure 12:
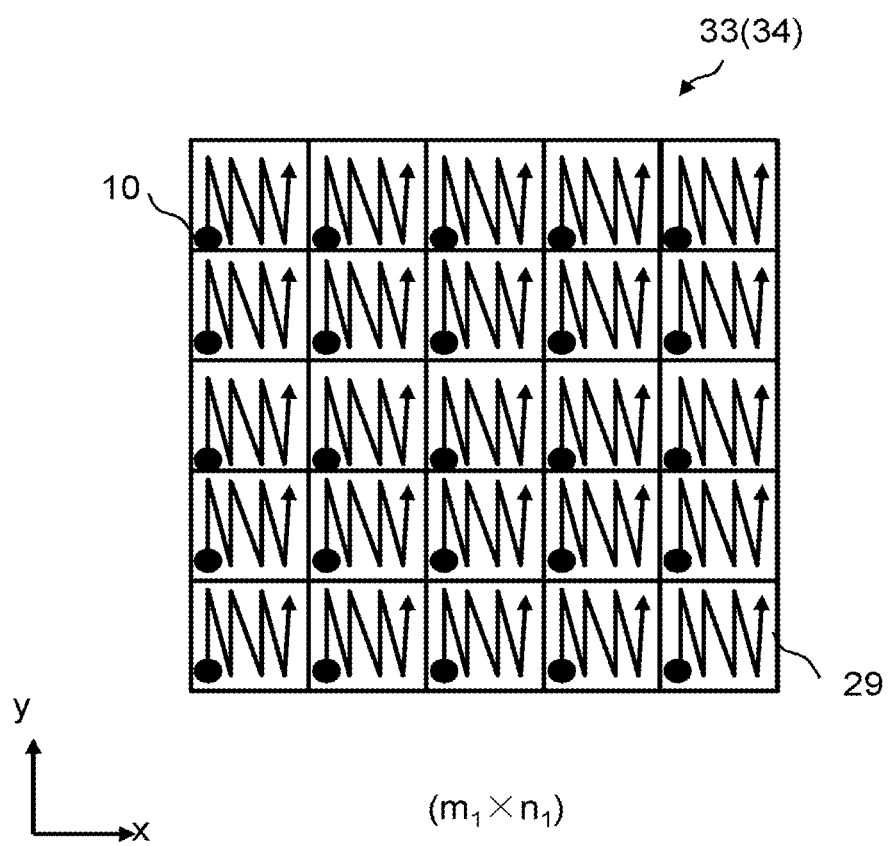
FIG. 12 illustrates a scanning operation with multiple beams according to the first embodiment.

FIG. 12 illustrates a scanning operation with multiple beams according to the first embodiment. FIG. 12 shows the case of multiple primary electron beams 20 of 5 rows×5 columns. The size of an irradiation region 34 that can be irradiated by one irradiation with the multiple primary electron beams 20 is defined by (x direction size obtained by multiplying a pitch between beams in the x direction of the multiple primary electron beams 20 on the substrate 101 by the number of beams in the x direction)×(y direction size obtained by multiplying a pitch between beams in the y direction of the multiple primary electron beams 20 on the substrate 101 by the number of beams in the y direction). Preferably, the width of each stripe region 32 is set to be the same as the size in the y direction of the irradiation region 34. In the case of FIGS. 11 and 12, the irradiation region 34 and the frame region 33 are of the same size. However, it is not limited thereto. The irradiation region 34 may be smaller than the frame region 33, or larger than it. Each beam of the multiple primary electron beams 20 scans a sub-irradiation region 29 concerned surrounded by the pitch between the beams in the x direction and the pitch between the beams in the y direction such that the beam concerned itself is located therein. Each primary electron beam 10 of the multiple primary electron beams 20 is associated with any one of the sub-irradiation regions 29 which are different from each other. When acquiring a secondary electron image in each irradiation region, each primary electron beam 10 is applied to the same position in the associated sub-irradiation region 29. The primary electron beam 10 is scanned in the sub-irradiation region 29 by collective deflection of all the multiple primary electron beams 20 by the beam deflector 208. The irradiation region 34, divided in sub-irradiation regions 29, is irradiated with multiple primary electron beams 20 simultaneously. When scanning one irradiation region 34 is completed, the irradiation position is moved to an adjacent frame region 33 in the same stripe region 32 by collectively deflecting all the multiple primary electron beams 20 by the beam deflector 208. By repeating this operation, the inside of the stripe region 32 is irradiated in order. After completing scanning one stripe region 32, the irradiation position is moved to the next stripe region 32 by moving the stage 105. As described above, a secondary electron image of each sub-irradiation region 29 is acquired by irradiation with each primary electron beam 10. By combining secondary electron images of respective sub-irradiation regions 29, a secondary electron image of the frame region 33, a secondary electron image of the stripe region 32, or a secondary electron image of the chip 332 is configured.

It is also preferable to group a plurality of chips 332 arranged, for example, in the x direction as one group, and to divide each group into a plurality of stripe regions 32 by a predetermined width in the y direction, for example. Then, moving between the stripe regions 32 may be performed not only for each chip 332 but also for each group.

In the case of acquiring an image by irradiating the substrate 101 with the multiple primary electron beams 20 while continuously moving the stage 105, the beam deflector 208 executes a tracking operation by performing collective deflection so that the irradiation position of the multiple primary electron beams 20 may follow the movement of the stage 105.

Here, since the pattern formed on the substrate 101 is a pattern formed by EUV lithography, its line width is narrow. Therefore, in order to accurately understand the pattern shape, more pattern edge information is needed.

Figure 13:
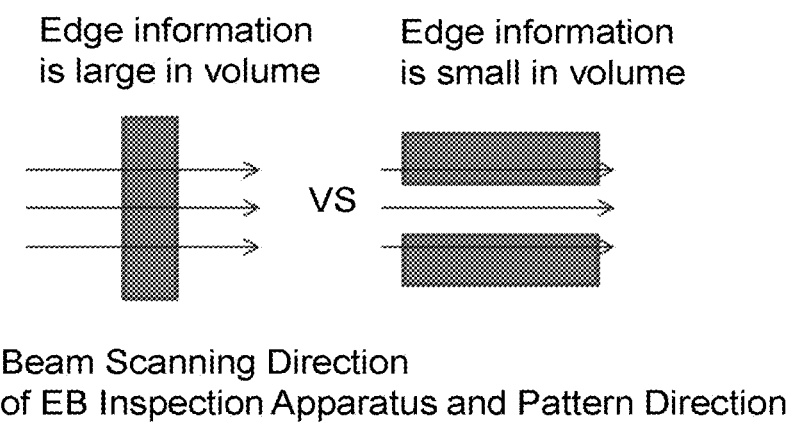
FIG. 13 shows a relation between an electron beam scanning direction and a pattern arrangement direction according to the first embodiment.

FIG. 13 shows a relation between an electron beam scanning direction and a pattern arrangement direction according to the first embodiment. In FIG. 13, in the case of a pattern extending parallelly to the scanning direction of the electron beam, since only a few beams are crossing the pattern edge, secondary electron information (edge information) associated with pattern shape and material contrast is small in volume. By contrast, in the case of a pattern extending perpendicularly to the scanning direction of the electron beam, since all beams are crossing the pattern edge and therefore, contrast associated with pattern shape and material contrast can be obtained, secondary electron information (edge information) is large in volume. Such pattern edge information difference is notable especially in the case of a one-dimensional pattern such as line and space pattern. Therefore, it is desirable to perform scanning with electron beams in the direction perpendicular to the pattern. On the other hand, with respect to the EUV exposure apparatus, a one-dimensional pattern may probably be arranged to extend parallel to the irradiation direction of the EUV light in order to avoid the influence of the shadow described above (mask 3D effect) and to improve the pattern resolution. Therefore, a one-dimensional pattern extending parallel to the irradiation direction of the EUV light may probably be printed to the substrate 101 such as a wafer. Then, also in the inspection apparatus 100, it is possible to use exposure apparatus information indicating a relation between the arrangement direction of the EUV mask 601 and the irradiation direction of the EUV light to the EUV mask 601 thereon in the EUV exposure apparatus. However, since the substrate 101 is a semiconductor device product itself, and a plurality of circuit layers are stacked therein, it is difficult to form the ID pattern 40 described above on the substrate 101 itself in order to perform pattern inspection for one chip of one layer. Then, according to the first embodiment, exposure apparatus information is added to the design data used as pattern data of the pattern formed on the EUV mask 601. It will be specifically described below.

Figure 14:
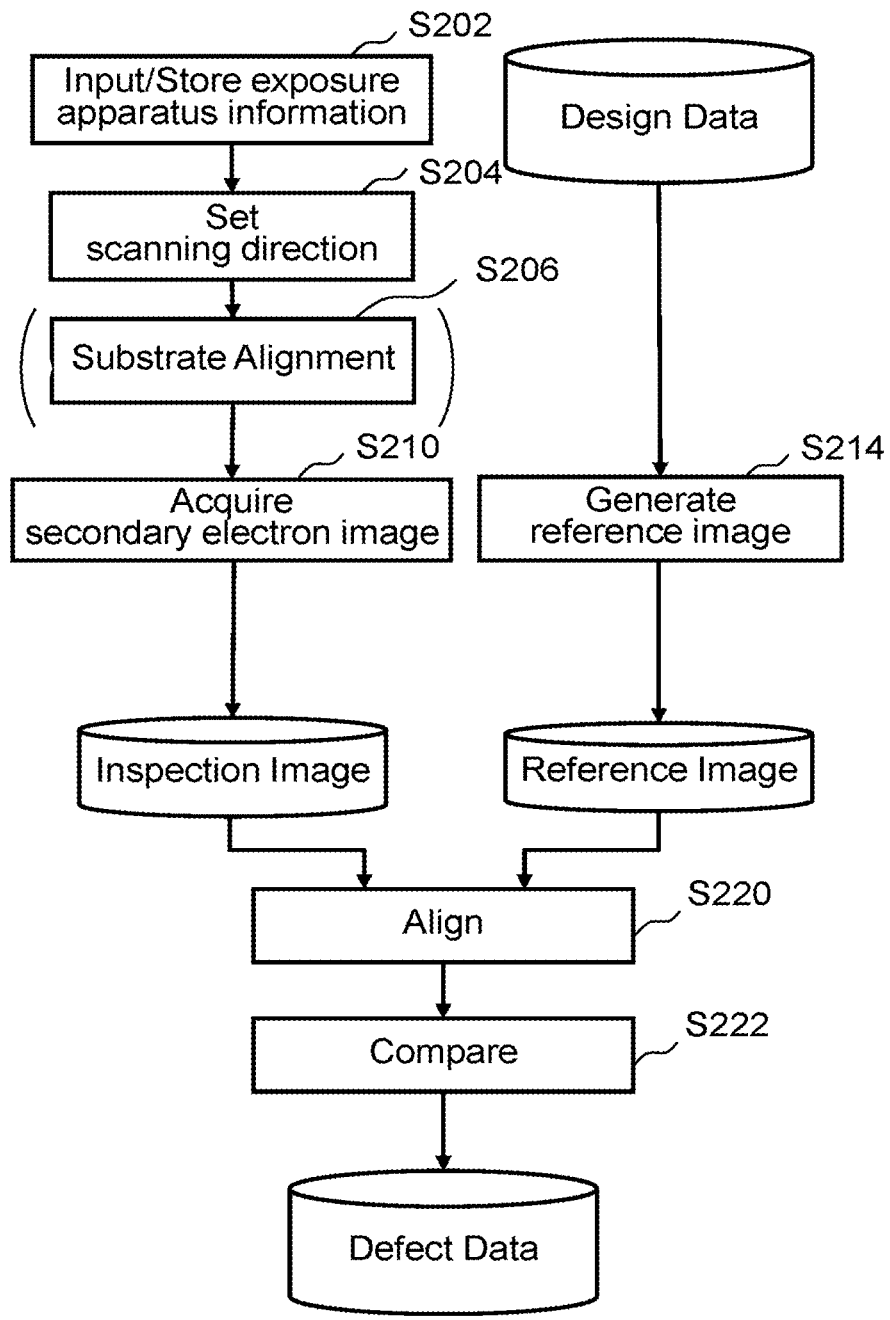
FIG. 14 is a flowchart showing main steps of an electron beam inspection method according to the first embodiment.

FIG. 14 is a flowchart showing main steps of an electron beam inspection method according to the first embodiment. In FIG. 14, the electron beam inspection method of the first embodiment executes a series of steps: an exposure apparatus information input/store step (S202), a scanning direction setting step (S204), a substrate alignment step (S206), a secondary electron image acquisition step (S210), a reference image generation step (S214), an alignment step (S220), and a comparison step (S222).

In the exposure apparatus information input/store step (S202), pattern design data to which exposure apparatus information has been added is input from the outside of the inspection apparatus 100 and stored in the storage device 109, wherein the exposure apparatus information indicates a relation, in the EUV exposure apparatus, between the arrangement direction of the substrate 101 (target object) and the movement direction of the wafer stage 304 (target object stage) to mount the substrate 101 thereon. In the EUV exposure apparatus here, an EUV light is incident from a predetermined direction on the EUV mask 601 with a pattern formed thereon, and the pattern of the EUV mask 601 is exposed and printed to the substrate 101 using a reflected EUV light. Also in the exposure apparatus, the EUV mask 601 is scanned with EUV lights being perpendicular to the plane including an incident direction and a reflection direction with respect to the EUV mask 601 and being parallel to the pattern surface of the EUV mask 601.

In the scanning direction setting step (S204), the scanning direction setting circuit 129 (setting unit) reads the exposure apparatus information added to the design data from the storage device 109, and sets the arrangement direction of EUV mask 601 to adjust the scanning direction of the multiple primary electron beams 20 (electron beam) based on the relation indicated in the exposure apparatus information.

Figure 15:
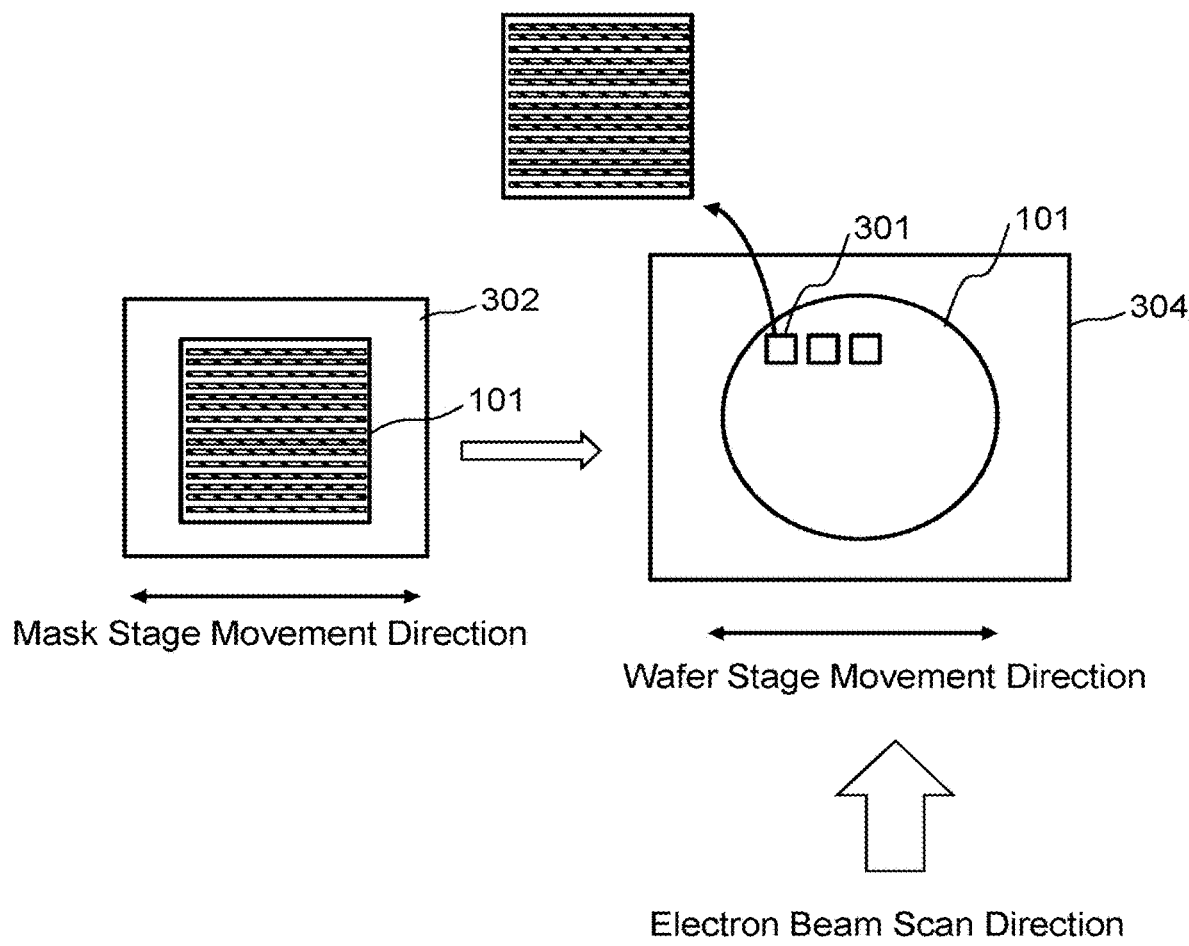
FIG. 15 shows an example of a relation between an EUV mask and an incident direction of an inspection light according to the first embodiment.

FIG. 15 shows an example of a relation between an EUV mask and an scanning direction of multiple primary electron beams according to the first embodiment. The example of FIG. 15 shows a line and space pattern extending in the horizontal direction in the figure, as a chip pattern, against the arrangement direction (e.g., upward direction in the figure) serving as a reference of the EUV mask 601. It is shown the case where the mask stage 302 moves in parallel to the extending direction of the line and space pattern. In an exposure apparatus, the desired region of EUV mask is exposed with the illumination area of an EUV light with a large circular arc of a few millimeter height and about 104 millimeter which corresponds to the chip width on a substrate, in one direction by a movement of a mask stage to mount the EUV mask thereon in a direction being perpendicular to a plane including an incident direction and a reflection direction of the EUV light with respect to the EUV mask in the exposure apparatus and being parallel to a pattern forming surface of the EUV mask. In that case also the wafer stage 304 moves in parallel to the extending direction of the line and space pattern which has been transferred to the substrate 101. Therefore, if in the EUV exposure apparatus the relation among the arrangement direction of the EUV mask 601, the arrangement direction of the substrate 101 (target object), the movement direction of the mask stage 302, and the movement direction of the wafer stage 304 (target object stage) to mount the substrate 101 thereon is known, the direction of the pattern transferred to the substrate 101 can be known. Therefore, with respect to the arrangement direction of the substrate 101 (target object) to which a fine one-dimensional pattern has been transferred, it turns out that the scanning direction of the multiple primary electron beams 20 should be the direction perpendicular to the movement direction of the wafer stage 304 (target object stage). Even if not specially calculating the direction of the pattern by analyzing the design data, it is possible to easily know from the information the scanning direction with respect to the arrangement position of the substrate 101.

As shown in FIG. 15, the relation between the arrangement direction of the substrate 101 (target object) and the movement direction of the wafer stage 304 (target object stage) to mount the substrate 101 thereon in the EUV exposure apparatus can be known from the relation between the arrangement direction of the EUV mask 601 and the movement direction of the mask stage 302 to mount the EUV mask 601 thereon in the EUV exposure apparatus. Therefore, information indicating the relation between the arrangement direction of the EUV mask 601 and the movement direction of the mask stage 302 to mount the EUV mask 601 thereon in the EUV exposure apparatus may be treated as exposure apparatus information.

As a method of scanning with the multiple primary electron beams 20 (electron beam) in the scanning direction which has been set, there is a method of adjusting the arrangement direction of the substrate 101 so that the predetermined scanning direction may be changed to a set of the arrangement direction of the substrate 101 to adjust the scanning direction. Alternatively, with respect to the predetermined arrangement direction of the substrate 101, there is a method of adjusting the arrangement direction of the substrate 101 on the stage 105, by the handling system (not shown) to transfer the substrate from outside of the system to the stage 105, the movement direction of the multiple primary electron beams 20 to be in the set scanning direction from the scanning direction shown in FIG. 12. A reader (not shown) that can optically read an ID (identifier) pattern formed on the substrate 101 or the carrier of the substrates (not shown) is disposed at the handling system (not shown).

When adjusting the arrangement direction of the substrate 101 so that the predetermined scanning direction interpreted by ID pattern recognition may change to a scanning direction which has been set, the substrate alignment step (S206) is carried out. When changing the scanning direction by the beam deflector 208, the substrate alignment step (S206) to be in accordance with the scanning direction may not be carried out.

In the substrate alignment step (S206), the arrangement direction of the substrate 101 is adjusted so that the predetermined scanning direction may be changed to a scanning direction having been set. Specifically, the arrangement direction of the substrate 101 is changed by the wafer rotation stage (not shown) to adjust the wafer orientation based on a notch and/or an orientation flat in the handling system of substrate 101. Alternatively, after taking out the substrate 101 from the inspection chamber 103 and adjusting its direction in the handling system etc. (not shown), it is carried into the inspection chamber 103 to be placed on the stage 105. Alternatively, before carrying the substrate 101 into the inspection chamber 103, or during it being carried, it is also preferable to perform the scanning direction setting step (S204), before placing the substrate 101 on the stage 105, to adjust the direction in the handling system interpreted by ID pattern recognition, etc. (not shown).

In the secondary electron image acquisition step (S210), the image acquisition mechanism 150 scans the substrate 101 with the multiple primary electron beams 20 (electron beam) in the set scanning direction, and acquires an image of a pattern having been exposed and printed onto the substrate 101. The image acquisition mechanism 150 irradiates the substrate 101, on which a plurality of figure patterns are formed, with the multiple primary electron beams 20 in order to detect the multiple secondary electron beams 300 emitted due to the irradiation with the multiple primary electron beams 20 onto the substrate 101 and acquire a secondary electron image. As described above, it is preferable that backscattered electrons and secondary electrons are projected on the multi-detector 222, or that backscattered electrons having high energy are filtered by the beam separator 218 and remaining secondary electrons are projected.

For acquiring an image, as described above, the multiple primary electron beams 20 are applied to the substrate 101 so that the multi-detector 222 may detect the multiple secondary electron beams 300 emitted from the substrate 101 by the irradiation with the multiple primary electron beams 20. Detected data (measured image data: secondary electron image data: inspection image data) on a secondary electron of each pixel in each sub irradiation region 29 detected by the multi-detector 222 is output to the detection circuit 106 in order of measurement. In the detection circuit 106, the detected data in analog form is converted into digital data by an A-D converter (not shown), and stored in the chip pattern memory 123. Then, the acquired measured image data is transmitted to the comparison circuit 108, together with information on each position from the position circuit 107.

In the reference image generation step (S214), the reference image generation circuit 112 generates a reference image corresponding to a mask die image, based on design data serving as a basis of a plurality of figure patterns formed on the substrate 101. Specifically, it operates as follows: First, design pattern data is read from the storage device 109 through the control computer 110, and each figure pattern defined in the read design pattern data is converted into a figure pattern whose size is the same as the pixel size configuring a secondary electron image generated from detected data of the secondary electron obtained through the multi-detector 222 or a figure pattern represented by a grid in a quantized size smaller than the pixel size. That is, the figure pattern is converted into image data composed of squares in units of a grid having a binary or multi-valued weight.

Regarding the design pattern data, basics of figures defined by the design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data serving as the figure data is input to the reference image generation circuit 112, the data is developed into data of each figure. Then, the figure code, the figure dimensions, and the like indicating the figure shape of each figure data are interpreted. Then, the reference image generation circuit 112 develops each figure data to design pattern image data of binary or multiple values as a pattern to be arranged in a square in units of grids of predetermined quantization dimensions, and outputs the developed data through the lithographic simulation and image shrinking with the magnification of EUV exposure apparatus (EUV scanner). In other words, the reference image generation circuit 112 reads design data, shrinks the image, apply the lithographic simulation and calculates occupancy occupied by a figure in the design pattern, for each square region obtained by virtually dividing the inspection region into squares in units of predetermined dimensions, and outputs n-bit occupancy data.

Figure 16:
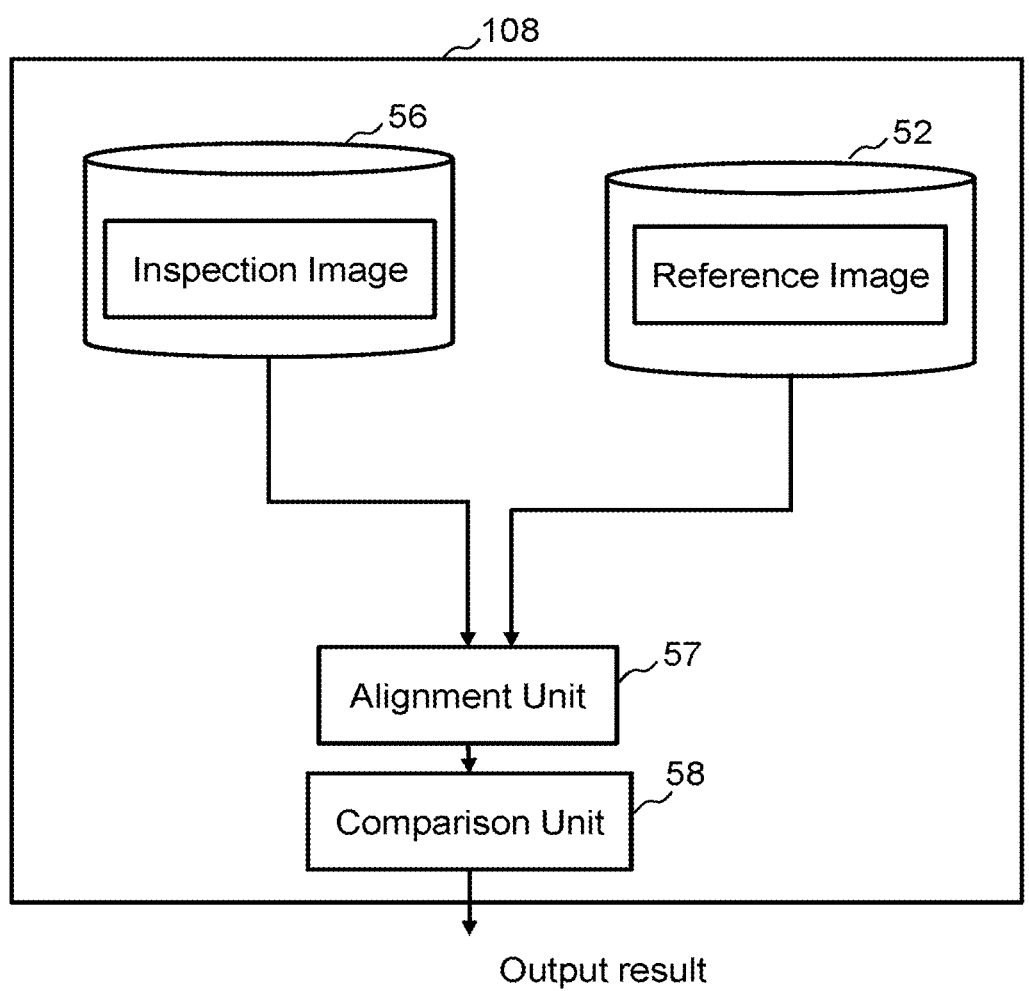
FIG. 16 shows an example of the internal configuration of a comparison circuit according to the first embodiment.

FIG. 16 shows an example of the internal configuration of a comparison circuit according to the first embodiment. In FIG. 16, storage devices 52 and 56, such as magnetic disk drives, an alignment unit 57, and a comparison unit 58 are arranged in the comparison circuit 108.

Each of the "units" such as the alignment unit 57 and the comparison unit 58 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the alignment unit 57 and the comparison unit 58, and calculated results are stored in a memory (not shown) or in the memory 118 each time.

According to the first embodiment, the sub-irradiation region 29 acquired by the scanning operation of one primary electron beam 10 is further divided into a plurality of mask die regions. The mask die region is used as a unit region of an image to be inspected.

In the comparison circuit 108, transmitted secondary electron image data is temporarily stored in the storage device 56, as a mask die image (inspection image to be inspected) of each mask die region. Similarly, transmitted reference image data is temporarily stored in the storage device 52 as a reference image for each mask die region.

In the alignment step (S220), the alignment unit 57 reads a mask die image serving as an inspection image, and a reference image corresponding to the mask die image, and provides alignment between the images based on units of sub-pixels smaller than units of pixels. For example, the alignment can be performed by a least-square method.

In the comparison step (S222), the comparison unit 58 compares the mask die image (secondary electron image) and the reference image concerned (an example of a predetermined image). In other words, the comparison unit 58 compares, for each pixel, reference image data with secondary electron image data. The comparison unit 58 compares them, for each pixel, based on predetermined determination conditions in order to determine whether or not there is a defect such as a shape defect. For example, if a gray scale level difference in each pixel is larger than a determination threshold Th, it is determined that there is a defect.

Alternatively, the contour of a pattern may be specified using edge information acquired much, and contours may be compared with each other. If a difference between the contours is larger than the determination threshold Th, it is determined that there is a defect.

Then, the comparison result is output. It may be output to the storage device 109, the monitor 117, or the memory 118, or alternatively, output from the printer 119.

In the example described above, the die-to-database inspection is performed. However, it is not limited thereto. Since each die has been printed with the same EUV mask 601, the die-to-die inspection may be conducted. Now, the case of performing the die-to-die inspection will be described.

In the alignment step (S220), the alignment unit 57 reads a mask die image (secondary electron image to be inspected) of the die 1 and a mask die image (secondary electron image to be inspected) of the die 2 on which the same pattern as that of the die 1 is formed, and provides alignment between both the images, based on units of sub-pixels smaller than units of pixels. For example, the alignment can be performed using a least-squares method.

In the comparison step (S222), the comparison unit 58 compares the mask die image (secondary electron image to be inspected) of the die 1 with the mask die image (secondary electron image to be inspected: another example of a determined image) of the die 2. The comparison unit 58 compares them, for each pixel, based on predetermined determination conditions in order to determine whether or not there is a defect such as a shape defect. For example, if a gray scale level difference in each pixel is larger than the determination threshold Th, it is determined that there is a defect. Since edge information is acquired much, the comparison can be performed with high accuracy.

Alternatively, the contour of a pattern may be specified using edge information acquired much, and contours may be compared with each other. If a difference between the contours is larger than the determination threshold Th, it is determined that there is a defect.

Then, the comparison result is output. It may be output to the storage device 109, the monitor 117, or the memory 118.

As described above, according to the first embodiment, patterns having been transferred to the substrate 101 with electron beams using an EUV exposure apparatus can be inspected with high accuracy.

In the above description, each of the " . . . circuits" includes processing circuitry. As the processing circuitry, for example, an electric circuit, computer, processor, circuit board, quantum circuit, semiconductor device, or the like can be used. Each " . . . circuit" may use common processing circuitry (the same processing circuitry), or different processing circuitry (separate processing circuitry). In the case of using programs, the programs are stored in a recording medium, such as a magnetic disk device, magnetic tape device, FD, ROM (Read Only Memory), or the like. For example, each of the position circuit 107, the comparison circuit 108, the reference image generation circuit 112, the scanning direction setting circuit 129, and the like includes processing circuitry. Similarly, each of the position circuit 607, the comparison circuit 608, the reference image generation circuit 612, the stage control circuit 614, the ID acquisition circuit 615, the transfer control circuit 616, the mirror control circuit 624, the detector drive control circuit 628, and the like includes processing circuitry. As the processing circuitry, for example, an electric circuit, computer, processor, circuit board, quantum circuit, semiconductor device, or the like can be used.

Embodiments have been explained referring to specific examples described above. However, the present invention is not limited to these specific examples.

While the apparatus configuration, control method, and the like not directly necessary for explaining the present invention are not described, some or all of them can be appropriately selected and used on a case-by-case basis when needed. For example, although description of the configuration of the control unit for controlling the inspection apparatus 100 is omitted, it should be understood that some or all of the configuration of the control unit can be selected and used appropriately when necessary.

In addition, any other mask inspection apparatus, electron beam inspection apparatus, mask inspection method, and electron beam inspection method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask inspection apparatus comprising:
an acquisition mechanism that acquires exposure apparatus information indicating an arrangement direction of an EUV (Extreme Ultraviolet) mask with a pattern formed thereon in an exposure apparatus which illuminates a large circular arc of a few millimeter height and about 104 millimeter width which corresponds to the chip width on a substrate, on the desired region of the EUV mask with an EUV light in an incident angle of a predetermined direction and prints the pattern of the EUV mask in four or eight times reduction ratio to a target object using a reflected EUV light thereon in one direction by a movement of a mask stage to mount the EUV mask thereon in a direction being perpendicular to a plane including an incident direction and a reflection direction of the EUV light with respect to the EUV mask in the exposure apparatus and being parallel to a pattern forming surface of the EUV mask, and the incident direction of the EUV light to the EUV mask;
a stage that mounts the EUV mask thereon such that a relation between an incident direction of an inspection light used for inspecting the pattern formed on the EUV mask, and the arrangement direction of the EUV mask serving as an inspection substrate is matched with a relation between the incident direction of the EUV light on the EUV mask, and the arrangement direction of the EUV mask in the exposure apparatus, based on a relation indicated by the exposure apparatus information acquired;
an image acquisition mechanism that acquires an optical image of the pattern by making the inspection light incident on the EUV mask and detecting a reflection inspection light reflected from the EUV mask, in a state where the relation between the incident direction of the inspection light used for inspecting the pattern formed on the EUV mask, and the arrangement direction of the EUV mask serving as the inspection substrate is matched with the relation between the incident direction of the EUV light on the EUV mask, and the arrangement direction of the EUV mask in the EUV exposure apparatus; and
a comparison processing circuit that compares the optical image acquired and a predetermined reference image.

2. The apparatus according to claim 1, wherein a coherent EUV light is used as the inspection light.

3. The apparatus according to claim 1, wherein
an identification pattern for identifying the exposure apparatus information has been formed in advance on the EUV mask, and
the acquisition mechanism reads the identification pattern, and acquires the exposure apparatus information by interpreting the identification pattern read.

4. An electron beam inspection apparatus comprising:
a storage device that stores design data of a pattern to which is added exposure apparatus information indicating an arrangement direction of a target object in an exposure apparatus which illuminates a large circular arc of a few millimeter height and about 104 millimeter width which corresponds to the chip width on a substrate, on the desired region of the EUV mask with an EUV light in an incident angle of a predetermined direction and prints the pattern of the EUV mask in four or eight times reduction ratio to the target object using a reflected EUV light thereon in one direction by a movement of a mask stage to mount the EUV mask thereon in a direction being perpendicular to a plane including an incident direction and a reflection direction of the EUV light with respect to the EUV mask in the exposure apparatus and being parallel to a pattern forming surface of the EUV mask, and the incident direction of the EUV light to the EUV mask;
a setting processing circuit that reads the exposure apparatus information added to the design data from the storage device to set an arrangement direction of the target object in an electron beam inspection apparatus with respect to the scanning direction of the electron beam, based on a relation indicated by the exposure apparatus information;
an image acquisition mechanism that acquires a pattern image of the pattern exposed and printed onto the target object, by scanning the target object with the electron beam in a set arrangement direction of the target object; and
a comparison processing circuit that compares an acquired optical image and a predetermined image.

5. The apparatus according to claim 4, wherein the scanning direction of the electron beam is set to be perpendicular to the movement direction of the target object stage.

6. A mask inspection method comprising:
acquiring exposure apparatus information indicating an arrangement direction of an EUV (Extreme Ultraviolet) mask with a pattern formed thereon in an exposure apparatus which illuminates a large circular arc of a few millimeter height and about 104 millimeter width which corresponds to the chip width on a substrate, on the desired region of the EUV mask with an EUV light in an incident angle of a predetermined direction and prints the pattern of the EUV mask in four or eight times reduction ratio to a target object using a reflected EUV light thereon in one direction by a movement of a mask stage to mount the EUV mask thereon in a direction being perpendicular to a plane including an incident direction and a reflection direction of the EUV light with respect to the EUV mask in the exposure apparatus and being parallel to a pattern forming surface of the EUV mask, and the incident direction of the EUV light to the EUV mask;

disposing the EUV mask on a stage such that a relation between an incident direction of an inspection light used for inspecting the pattern formed on the EUV mask, and the arrangement direction of the EUV mask serving as an inspection substrate is matched with a relation between the incident direction of the EUV light on the EUV mask, and the arrangement direction of the EUV mask in the exposure apparatus, based on a relation indicated by the exposure apparatus information acquired;

acquiring an optical image of the pattern by making the inspection light incident on the EUV mask and detecting a reflection inspection light reflected from the EUV mask, in a state where the relation between the incident direction of the inspection light used for inspecting the pattern formed on the EUV mask, and the arrangement direction of the EUV mask serving as an inspection substrate is matched with the relation between the incident direction of the EUV light on the EUV mask, and the arrangement direction of the EUV mask in the EUV exposure apparatus; and comparing the optical image acquired and a predetermined reference image, and outputting a comparison result.

7. The method according to claim 6, wherein a coherent EUV light is used as the inspection light.

8. The method according to claim 6, wherein
an identification pattern for identifying the exposure apparatus information has been formed in advance on the EUV mask, and
the exposure apparatus information is acquired by reading the identification pattern and interpreting the identification pattern read.

9. An electron beam inspection method comprising:

storing, in a storage device, design data of a pattern to which is added exposure apparatus information indicating an arrangement direction of a target object in an exposure apparatus which illuminates a large circular arc of a few millimeter height and about 104 millimeter width which corresponds to the chip width on a substrate, on the desired region of the EUV mask with an EUV light in an incident angle of a predetermined direction and prints the pattern of the EUV mask in four or eight times reduction ratio to the target object using a reflected EUV light thereon in one direction by a movement of a mask stage to mount the EUV mask thereon in a direction being perpendicular to a plane including an incident direction and a reflection direction of the EUV light with respect to the EUV mask in the exposure apparatus and being parallel to a pattern forming surface of the EUV mask, and the incident direction of the EUV light to the EUV mask;

setting an arrangement direction of the target object in an electron beam inspection apparatus by reading the exposure apparatus information added to the design data from the storage device in order to set the scanning direction, based on a relation indicated by the exposure apparatus information;

acquiring a pattern image of the pattern exposed and printed onto the target object, by scanning the target object with the electron beam in a set arrangement direction of the target object; and comparing the optical image acquired and a predetermined image, and outputting a comparison result.

10. The method according to claim 9, wherein the scanning direction of the electron beam is set to be perpendicular to the movement direction of the target object stage.

* * * * *